(12) United States Patent
Singh et al.

(10) Patent No.: US 10,593,627 B2
(45) Date of Patent: Mar. 17, 2020

(54) DORIC PILLAR SUPPORTED MASKLESS AIRGAP STRUCTURE FOR CAPACITANCE BENEFIT WITH UNLANDED VIA SOLUTION

(71) Applicant: Intel Corporation, Santa Clara, CA (US)

(72) Inventors: Kanwal Jit Singh, Portland, OR (US); Kevin Lin, Beaverton, OR (US); Robert Lindsey Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/574,816

(22) PCT Filed: Jun. 25, 2015

(86) PCT No.: PCT/US2015/037835
§ 371 (c)(1),
(2) Date: Nov. 16, 2017

(87) PCT Pub. No.: WO2016/209246
PCT Pub. Date: Dec. 19, 2016

(65) Prior Publication Data
US 2018/0145035 A1    May 24, 2018

(51) Int. Cl.
*H01L 23/532* (2006.01)
*H01L 29/06* (2006.01)
(Continued)

(52) U.S. Cl.
CPC .... *H01L 23/53295* (2013.01); *H01L 21/7682* (2013.01); *H01L 21/76808* (2013.01);
(Continued)

(58) Field of Classification Search
CPC ........... H01L 23/53295; H01L 29/0649; H01L 23/5226; H01L 21/76808; H01L 21/7682; H01L 2221/1047; H01L 2221/1042
See application file for complete search history.

(56) References Cited

U.S. PATENT DOCUMENTS 5,171,713 A * 12/1992 Matthews ......... H01L 21/28211
148/DIG. 20
5,567,982 A   10/1996 Bartelink
(Continued)

FOREIGN PATENT DOCUMENTS

WO    WO 2016209207    12/2016

OTHER PUBLICATIONS

International Search Report and Written Opinion for International Patent Application No. PCT/US2015/037835 dated Mar. 25, 2016, 14 pgs.
(Continued)

*Primary Examiner* — Bac H Au
(74) *Attorney, Agent, or Firm* — Schwabe, Williamson & Wyatt, P.C.

(57) ABSTRACT

Embodiments of the invention include interconnect layers with floating interconnect lines and methods of forming such interconnect layers. In an embodiment, a plurality of openings are formed in a first sacrificial material layer. Conductive vias and dielectric pillars may be formed in the openings. A second sacrificial material layer may then be formed over the pillars, the vias, and the first sacrificial material layer. In an embodiment, a permeable etchstop layer is formed over a top surface of the second sacrificial layer. Embodiments then include forming an interconnect line in the second sacrificial material layer. In an embodiment, the first and second sacrificial material layers are removed through the permeable etchstop layer after the interconnect line has been formed. According to an embodiment, the
(Continued)

permeable etchstop layer may then be stuffed with a fill material in order to harden the permeable etchstop layer.

11 Claims, 16 Drawing Sheets

(51) Int. Cl.
*H01L 23/522* (2006.01)
*H01L 21/768* (2006.01)
*H01L 23/498* (2006.01)
*H01L 21/764* (2006.01)

(52) U.S. Cl.
CPC .. *H01L 21/76816* (2013.01); *H01L 21/76826* (2013.01); *H01L 21/76829* (2013.01); *H01L 21/76834* (2013.01); *H01L 23/49827* (2013.01); *H01L 23/5222* (2013.01); *H01L 23/5226* (2013.01); *H01L 29/0649* (2013.01); *H01L 21/764* (2013.01); *H01L 2221/1042* (2013.01); *H01L 2221/1047* (2013.01)

(56) References Cited

U.S. PATENT DOCUMENTS

| | | | | |
|---|---|---|---|---|
| 5,798,559 A * | 8/1998 | Bothra | ................ | H01L 21/7682 257/508 |
| 5,953,626 A * | 9/1999 | Hause | ................ | H01L 21/7682 257/E21.581 |
| 5,998,293 A * | 12/1999 | Dawson | ............. | H01L 21/7682 257/E21.581 |
| 6,368,939 B1 * | 4/2002 | Sasaki | ............... | H01L 21/76802 438/421 |
| 6,492,732 B2 * | 12/2002 | Lee | ................... | H01L 21/76802 257/758 |
| 6,596,624 B1 * | 7/2003 | Romankiw | ......... | H01L 21/7682 257/E21.511 |
| 6,667,552 B1 * | 12/2003 | Buynoski | .......... | H01L 21/32053 257/758 |
| 6,747,347 B2 * | 6/2004 | Farrar | .................... | H01L 23/42 257/685 |
| 6,815,329 B2 * | 11/2004 | Babich | ................ | H01L 21/7681 257/E21.579 |
| 6,984,577 B1 * | 1/2006 | Zhao | ................ | H01L 21/76802 257/E21.577 |
| 8,877,631 B2 * | 11/2014 | Engelhardt | ......... | H01L 21/7682 438/622 |
| 2002/0016058 A1 | 2/2002 | Zhao | | |
| 2004/0102031 A1 | 5/2004 | Kloster | | |
| 2004/0145030 A1 * | 7/2004 | Meagley | ............ | H01L 21/7682 257/642 |
| 2004/0147111 A1 * | 7/2004 | Huang | .............. | H01L 21/76801 438/624 |
| 2004/0164419 A1 | 8/2004 | Ahn et al. | | |
| 2004/0175896 A1 | 9/2004 | Chan et al. | | |
| 2004/0222533 A1 * | 11/2004 | Nakamura | ........ | H01L 21/76801 257/774 |
| 2009/0302475 A1 * | 12/2009 | Korogi | ................ | H01L 21/7682 257/761 |

OTHER PUBLICATIONS

International Preliminary Report on Patentability for International Patent Application No. PCT/US15/37835, dated Jan. 4, 2018, 11 pages.
Search Report for European Patent Application No. 15896533.5, dated Jan. 21, 2019, 7 pgs.

* cited by examiner

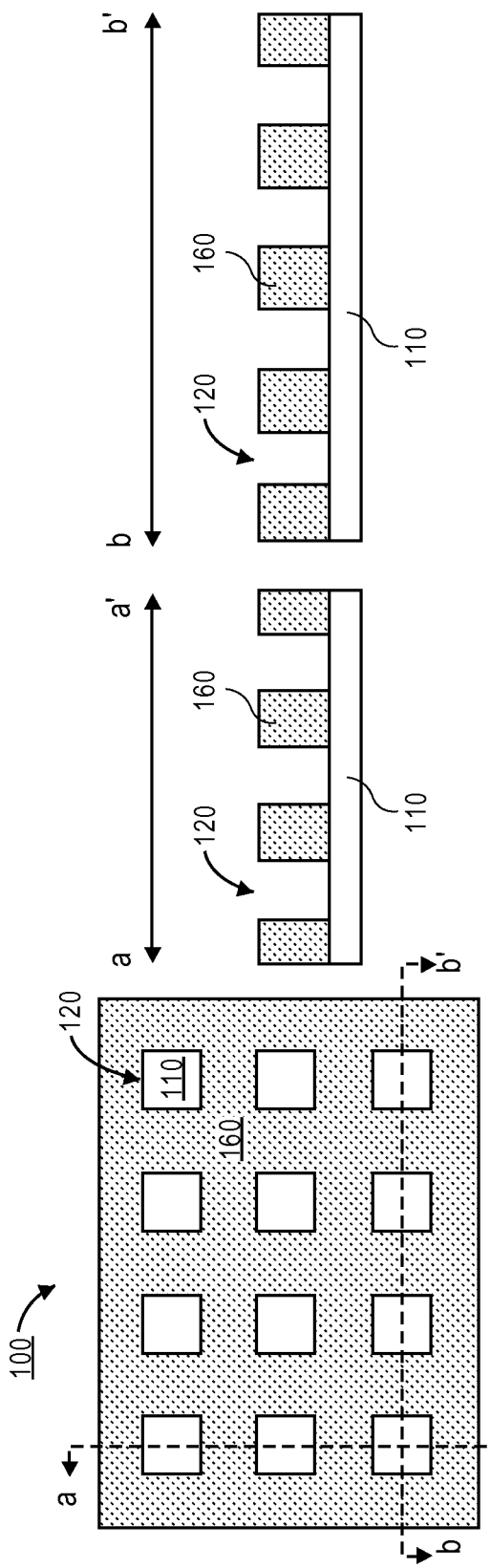
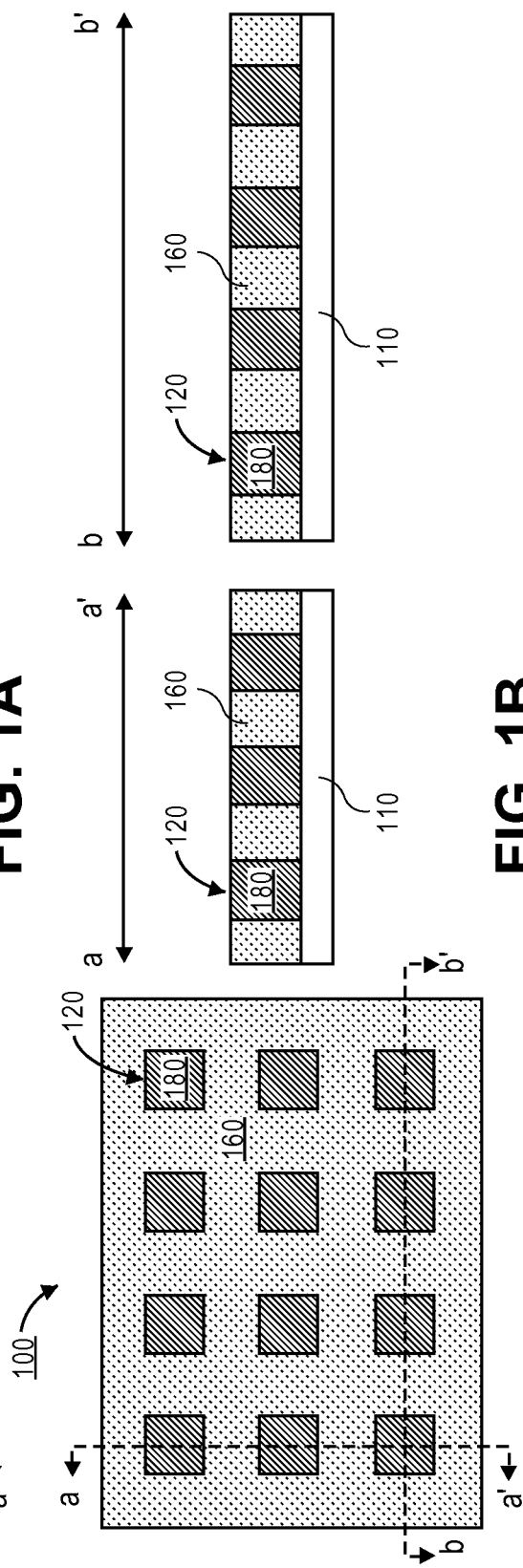
FIG. 1A
FIG. 1B

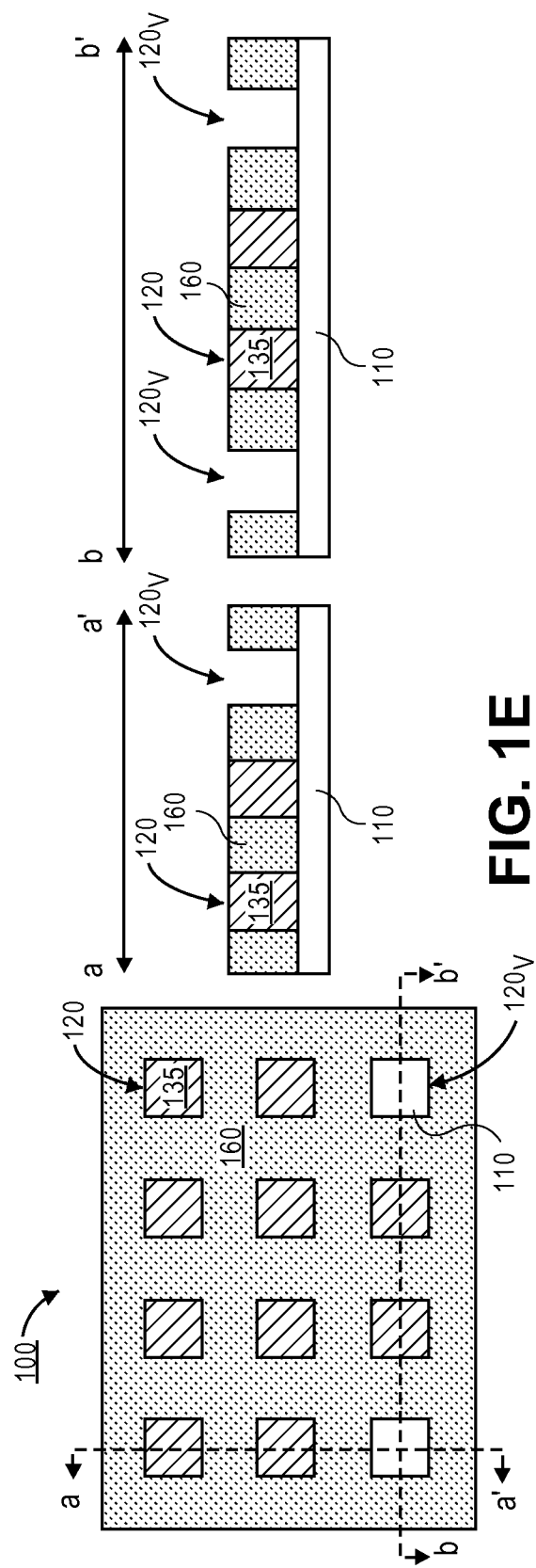
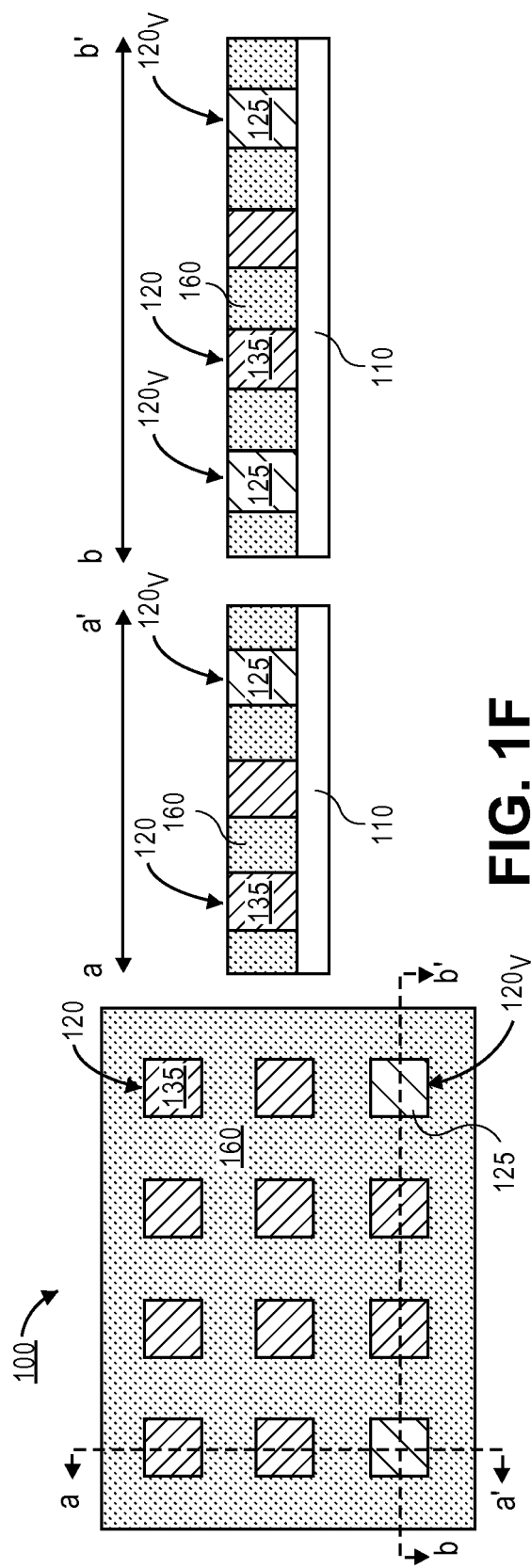
FIG. 1E
FIG. 1F

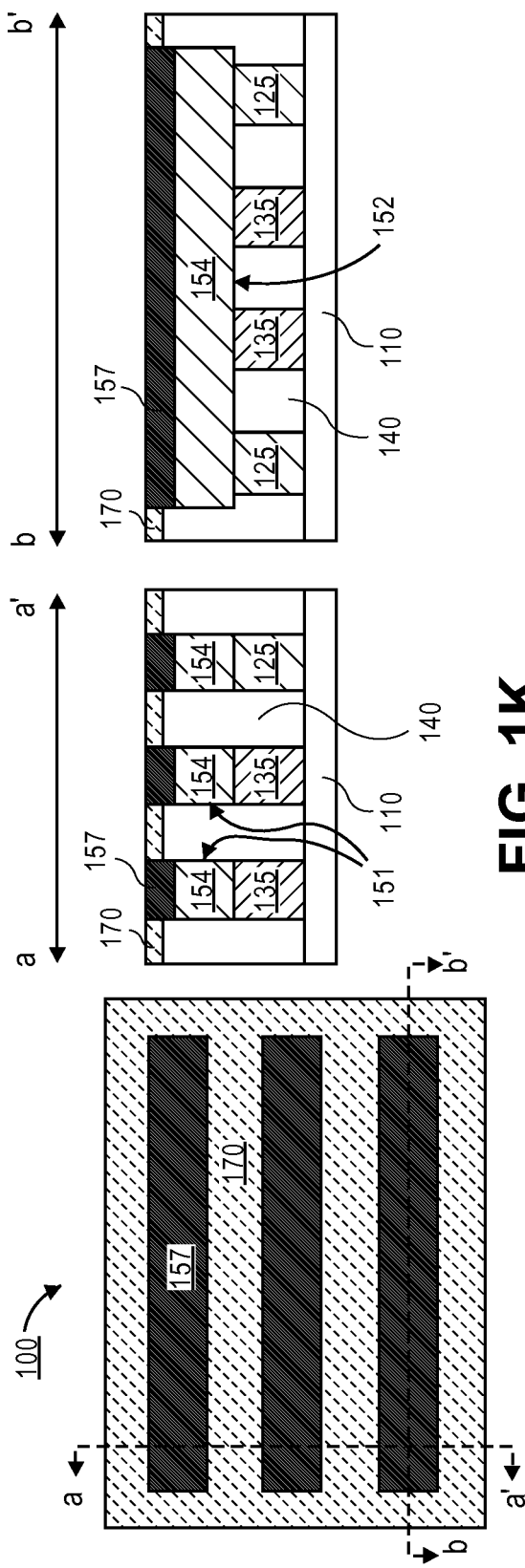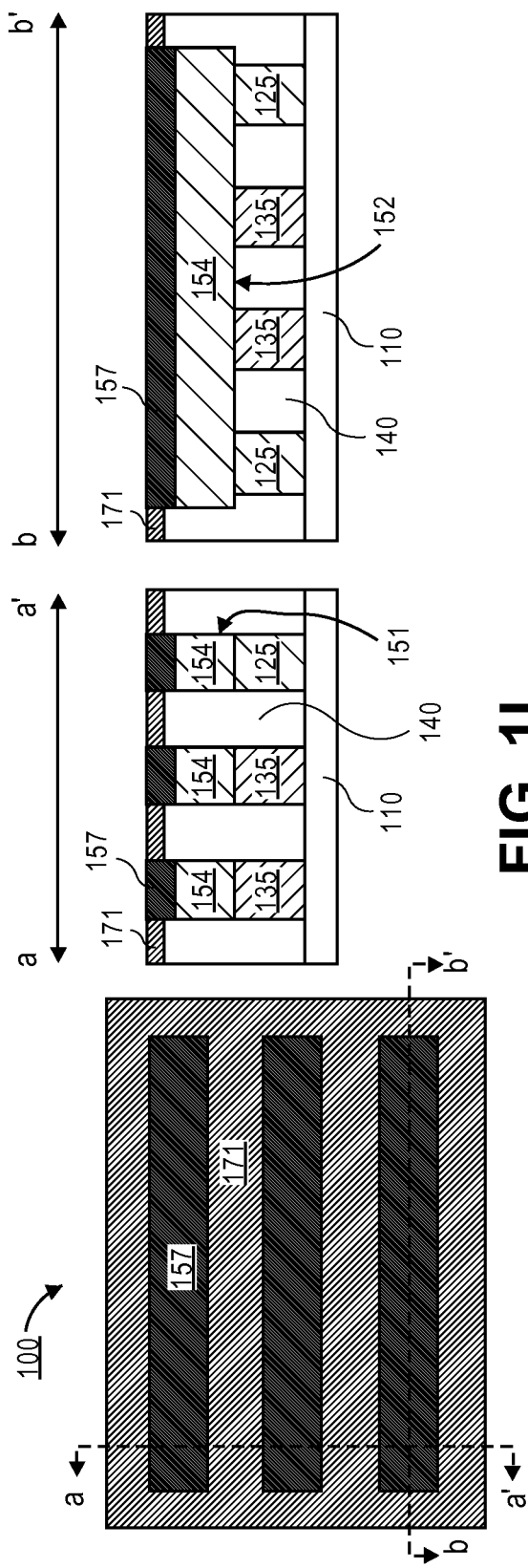
FIG. 1K
FIG. 1L

DORIC PILLAR SUPPORTED MASKLESS AIRGAP STRUCTURE FOR CAPACITANCE BENEFIT WITH UNLANDED VIA SOLUTION

CROSS-REFERENCE TO RELATED APPLICATION

This patent application is a U.S. National Phase Application under 35 U.S.C. § 371 of International Application No. PCT/US2015/037835, filed Jun. 25, 2015, entitled "DORIC PILLAR SUPPORTED MASKLESS AIRGAP STRUCTURE FOR CAPACITANCE BENEFIT WITH UNLANDED VIA SOLUTION," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue.

Integrated circuits commonly include electrically conductive microelectronic structures, which are known in the arts as vias, to electrically connect metal lines or other interconnects above the vias to metal lines or other interconnects below the vias. The interconnects and vias are typically separated from each other by an interlayer dielectric material. As the pitch between interconnect lines and the spacing between layers continues to be scaled down, capacitive coupling between lines and vias increase. Accordingly, typical back-end interconnect stacks utilize low-k dielectric materials to reduce the capacitance. In some back-end interconnect stacks, air-gaps may be used to replace portions of the low k-dielectric materials in order to further decrease the capacitance.

Air-gaps are typically formed with an "air-gap etch" that removes portions of the interlayer dielectric material. After the interlayer dielectric material is removed, a non-conformal material is deposited over the openings formed by the air-gap etch in order to form an intentional "key-hole void". However, the formation of air-gaps with an air-gap etching process has several disadvantages. For example, unlanded or partially landed vias produce the risk of a short-circuit. During the via formation, an unlanded or partially landed via may punch through the non-conformal fill material and provide an opening into the air-gap. When the via metal is deposited the metal will also fill the air-gap and may result in a short. Accordingly, the risk of shorting the device needs to be mitigated by using additional masks that block the formation of air-gaps near vias. Additionally, the air-gap etching process that is presently used is a dry etching process. Accordingly, the interlayer dielectric material is only able to be removed from between interconnect lines due to the anisotropic nature of dry-etching processes. As such, the dielectric material below the interconnect lines remains behind and there is not a beneficial reduction in the layer-to-layer capacitance.

Thus, improvements are needed in the area of via manufacturing technologies.

BRIEF DESCRIPTION OF THE DRAWINGS

FIG. 1A illustrates a schematic plan view and cross-sectional views of an interconnect layer that includes a plurality of openings, in accordance with an embodiment of the invention.

FIG. 1B illustrates a schematic plan view and cross-sectional views of the interconnect layer after a photoresist material has been deposited into the openings, in accordance with an embodiment of the invention.

FIG. 1E illustrates a schematic plan view and cross-sectional views of the interconnect layer after the remaining photoresist material is removed from the openings to form via openings, in accordance with an embodiment of the invention.

FIG. 1F illustrates a schematic plan view and cross-sectional views of the interconnect layer after the vias have been formed, in accordance with an embodiment of the invention.

FIG. 1K illustrates a schematic plan view and cross-sectional views of the interconnect layer after the sacrificial material is removed, in accordance with an embodiment of the invention.

FIG. 1L illustrates a schematic plan view and cross-sectional views of the interconnect layer after the permeable etchstop layer is hardened, in accordance with an embodiment of the invention.

DETAILED DESCRIPTION OF THE INVENTION

Figure 1C:
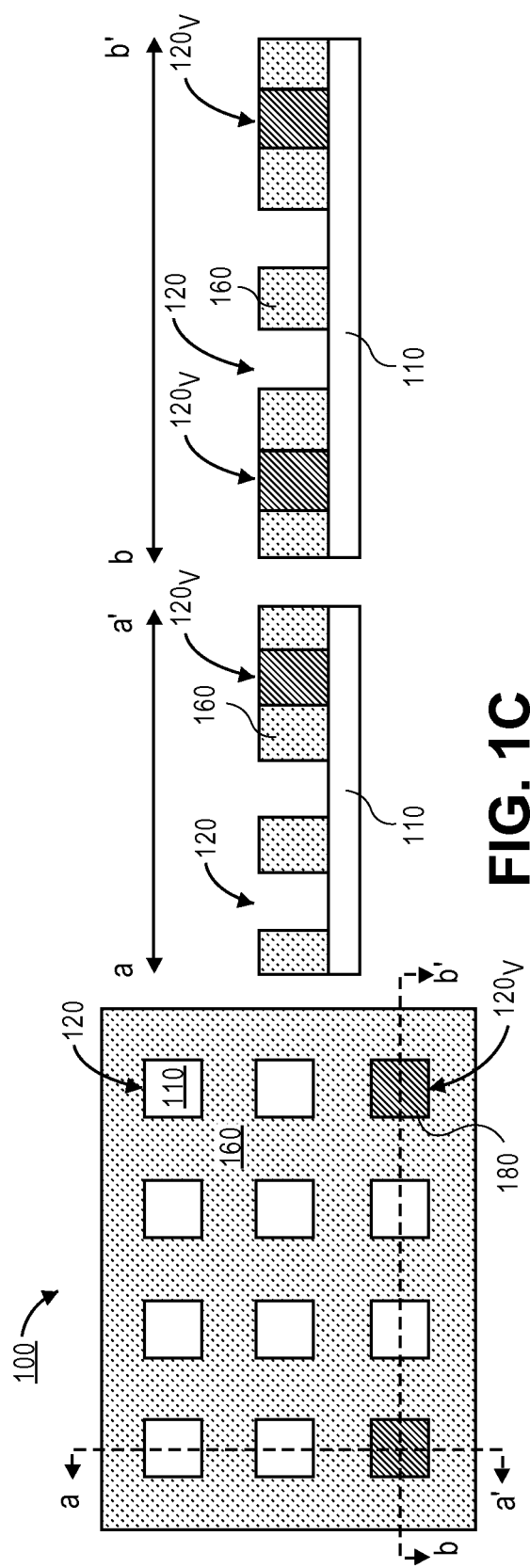
FIG. 1C illustrates a schematic plan view and cross-sectional views of the interconnect layer after the photoresist material is patterned to form via openings where a pillar is desired, in accordance with an embodiment of the invention.

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include interconnect layers with floating interconnect lines. As used herein, floating interconnect lines are conductive lines formed in an interconnect layer that include a bottom surface that is at least partially unsupported. The unsupported bottom surface is boarded by an air-gap that allows for increased reduction in capacitive coupling between interconnect layers. Embodiments of the invention provide support to the floating interconnect lines by forming pillars and vias below portions of the bottom surface of the interconnect lines. Additionally, embodiments of the invention include forming air-gaps between neighboring interconnect lines within an interconnect layer, and forming air-gaps between vias. Accordingly, embodiments of the invention allow for greater reductions in line-to-line capacitive coupling and layer-to-layer capacitive coupling than is possible with prior "air-gap etching" processes, such as those described above. Furthermore, embodiments of the invention provide self-aligned etchstop layers over the floating interconnect lines that prevents unlanded, or partially landed vias from breaking through to the air-gaps. As such, additional masking operations are not needed to prevent the formation of air-gaps proximate to locations where a via is desired.

Referring now to FIGS. 1A-1M, a series of plan views and corresponding cross-sectional views are used to illustrate various processing operations that may be used to form floating interconnect lines with air-gaps between vias and below the interconnect lines, according to embodiments of the invention.

Referring now to FIG. 1A, a plan view illustration of an interconnect layer 100 with a plurality of openings 120 formed into with sacrificial material layer 160 is shown.

According to an embodiment, the sacrificial material layer 160 is a material that may be selectively removed with a chemical process through a permeable layer. In one embodiment, the sacrificial material 160 may be removed with a wet etching chemistry or is otherwise soluble in a particular solvent. Additional embodiments may include a sacrificial material that is removable through a permeable layer with a vapor phase process, with a plasma process, or the like. Removal of the sacrificial material layer 160 through a permeable layer allows for the sacrificial material layer 160 to be removed through a permeable etchstop layer formed in a subsequent processing operation. Prior to the removal of the sacrificial material layer 160, the sacrificial material layer 160 provides structure (e.g., scaffolding) for the interconnect lines, vias, and pillars to be formed over. Embodiments include a sacrificial material layer 160 that may also be a material that can be patterned with a dry-etching process. In an embodiment, the sacrificial material may be any material that can be selectively removed through a permeable layer while at the same time the removal process does not damage the pillars, vias, and interconnect lines. Embodiments of the invention include a sacrificial material layer 160 that is a metal oxide, a metal nitride, a ceramic, an amorphous silicon, an amorphous carbon, or the like. By way of example, the sacrificial material layer 160 may be a dielectric material such as such as titanium nitride.

According to an embodiment, the openings 120 are formed through the entire thickness of the sacrificial material layer 160 to expose an underlying substrate 110, as illustrated in FIG. 1A. According to an embodiment, the openings 120 may be formed at every potential location where a via or a pillar may be formed. Embodiments of the invention may form the openings 120 with any patterning process that provides a suitable pitch and critical dimension needed for the formation of vias in the interconnect structure. By way of example, the openings 120 may be patterned with one or more photolithography patterning process, with directed self-assembly (DSA) processes, or the like.

In an embodiment, the interconnect layer 100 may be one layer in a back end of line (BEOL) stack that includes a plurality of interconnect layers. As such, the interconnect layer 100 may be formed over another interconnect layer. For example, the underlying substrate 110 may be an etchstop layer formed over an additional interconnect layer. Additional embodiments may include forming the interconnect layer 100 as the first interconnect layer over a semiconductor material on which one or more transistors or other devices are formed. Implementations of the invention may be formed or carried out on an underlying substrate 110, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

Referring now to FIG. 1B, photoresist material 180 is deposited into the openings 120. In an embodiment, the photoresist material may be spun-on. The photoresist material 180 may be any suitable photoresist material, such as a positive or negative photoresist material. By way of example, the photoresist material 180 may be a chemically amplified resist (CAR).

Referring now to FIG. 1C, the photoresist material 180 is patterned in order to define openings 120 that will be used to form via openings $120_V$. For example, a photolithography mask (not shown) may be used to selectively expose desired openings 120. Thereafter, the exposed photoresist material 180 may be developed in order to clear the exposed portions of the photoresist material. In the illustrated embodiment, the photoresist material 180 is removed from each of the openings 120 where a via opening $120_V$ is not desired. It is to be appreciated that, while two via openings $120_V$ are illustrated in FIG. 1C, additional embodiments may include as few as one via opening $120_V$ or more than two via openings $120_V$.

Figure 1D:
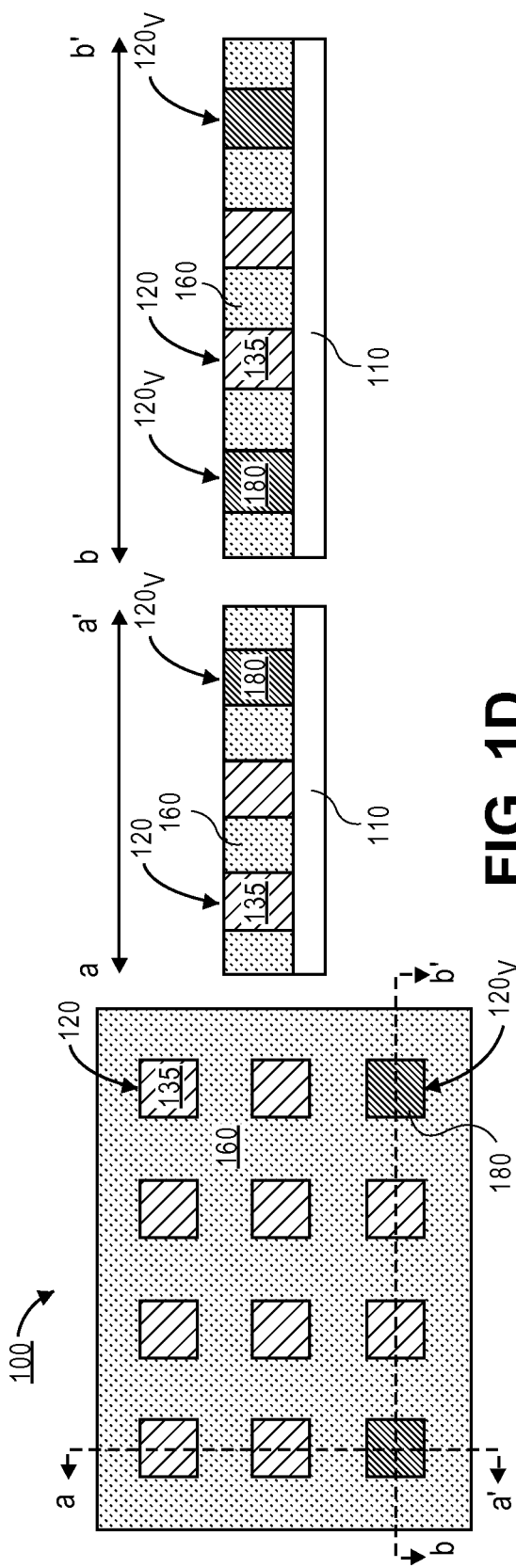
FIG. 1D illustrates a schematic plan view and cross-sectional views of the interconnect layer after the pillars have been deposited into the openings, in accordance with an embodiment of the invention.

Referring now to FIG. 1D, a dielectric material is deposited into each of the openings 120. The dielectric material is used to form pillars 135 that will support the floating interconnect lines that will be formed in a subsequent processing operation. As illustrated in the cross-sectional view along line b-b', two pillars 135 are formed in openings 120, though embodiments are not limited to such configurations. According to an embodiment, the pillars 135 may be formed with a low-k dielectric material. In an embodiment, the pillars 135 may be a hardmask material. By way of example, the pillars may be silicon dioxide, carbon doped silicon dioxide, porous silicon dioxide, silicon nitrides, metal oxides, metal nitrides, or the like. Additional embodiments may include other dielectric materials, such as fluorocarbon based dielectrics, oxyfluorides, carbon based dielectrics, or the like. Embodiments include depositing the pillars 135 into the openings 120 with any suitable process, such as, for example, physical vapor deposition (PVD), chemical vapor deposition (CVD), atomic layer deposition (ALD), a spin coating process, or the like. According to an embodiment, any overburden from the deposition process may be removed with a polishing operation.

Referring now to FIG. 1E, the photoresist material 180 is removed from the via openings $120_V$. In an embodiment, the photoresist material 180 may be removed with an ashing process. Though not illustrated in FIG. 1E, it is to be appreciated that if the underlying substrate 110 is an etchstop layer, then an etching process may be implemented to extend the openings $120_V$ through the underlying substrate 110 so that contact to an underlying interconnect layer may be made.

Referring now to FIG. 1F, vias 125 are formed in the via openings $120_V$. According to an embodiment, the vias 125 may be any suitable conductive material, stacks of conductive materials, and/or conductive alloys. By way of example, the vias 125 may include Ag, Au, Co, Cu, Mo, Ni, NiSi, Pt, Ru, TiN, W, or the like. Embodiments of the invention include depositing the vias 125 with any suitable deposition process, such as PVD, CVD, ALD, electroplating, electroless plating, or the like. Overburden from the deposition of the conductive material may then be recessed, (e.g., with a polishing process) to ensure that a top surface of the vias 125 are substantially coplanar with a top surface of the pillars 135.

Figure 1G:
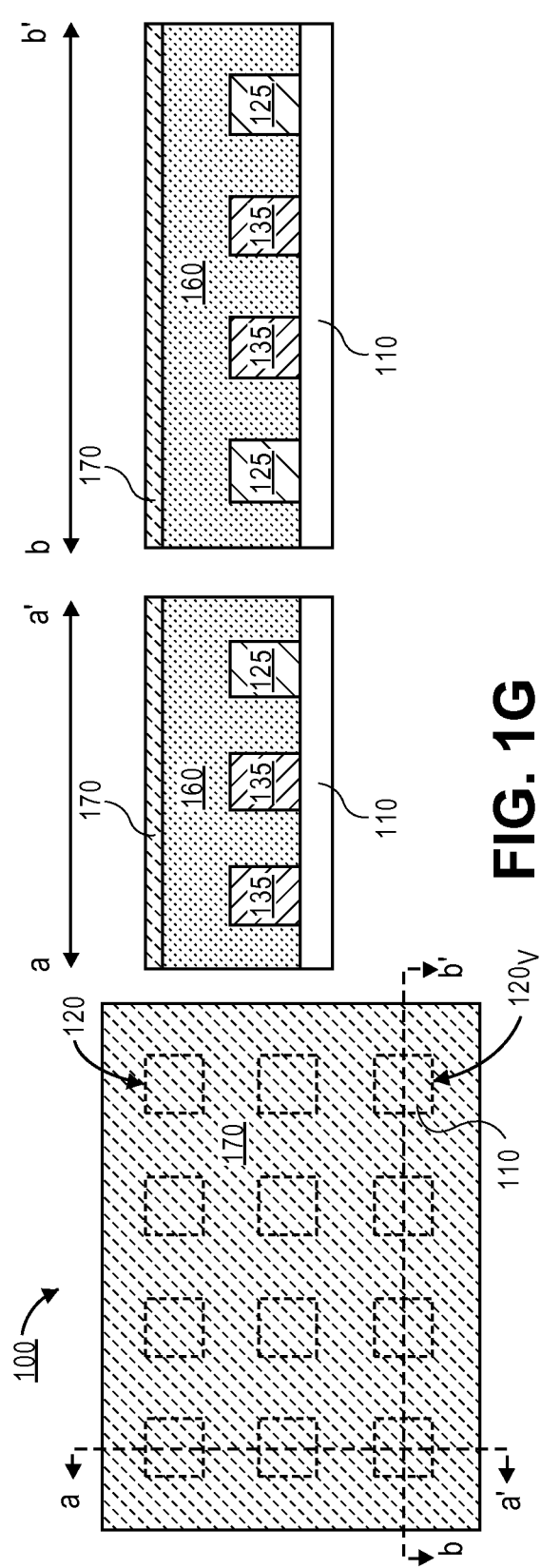
FIG. 1G illustrates a schematic plan view and cross-sectional views of the interconnect layer after a sacrificial material is deposited over the pillars and vias and a permeable etchstop material is formed over the sacrificial material, in accordance with an embodiment of the invention.

Referring now to FIG. 1G, the thickness of the sacrificial material layer 160 is increased by depositing a second layer of sacrificial material layer 160 over the top surfaces of each of the vias 125 and the pillars 135. According to an embodiment, the thickness of the sacrificial material 160 is increased so that an interconnect line trench may be patterned over the top surfaces of the vias 125 and the pillars

135. Additionally, a permeable etchstop layer 170 is disposed over the top surface of the sacrificial material 160. As illustrated in the plan view, the locations of the openings 120, 120$_V$ are illustrated as dashed lines in order to indicate that they are formed below the surface of the permeable etchstop layer 170. The permeable etchstop layer 170 is a material that will allow the sacrificial material 160 to be removed through it. For example, in a subsequent processing operation, the sacrificial material 160 may be dissolved and the dissolved sacrificial material is able to pass through the permeable etchstop layer 170 in order to remove the sacrificial material 160 from the interconnect layer 100. According to an embodiment, the permeable etchstop layer 170 is a porous dielectric material that has a k-value that is sufficient for use as an etchstop material. In an embodiment, the permeable etchstop layer 170 may be a porous oxide or nitride of silicon or aluminum. By way of example, the permeable etchstop layer 170 may include carbon-doped silicon oxides, silicon-nitrides, or the like. In an embodiment, once the sacrificial material 160 is removed through the permeable etchstop layer 170, the porosity of the permeable etchstop layer 170 may be reduced. For example, the pores in the permeable etchstop layer 170 may be plugged with an additional dielectric material with a plugging process that will be described in greater detail below.

Figure 1H:
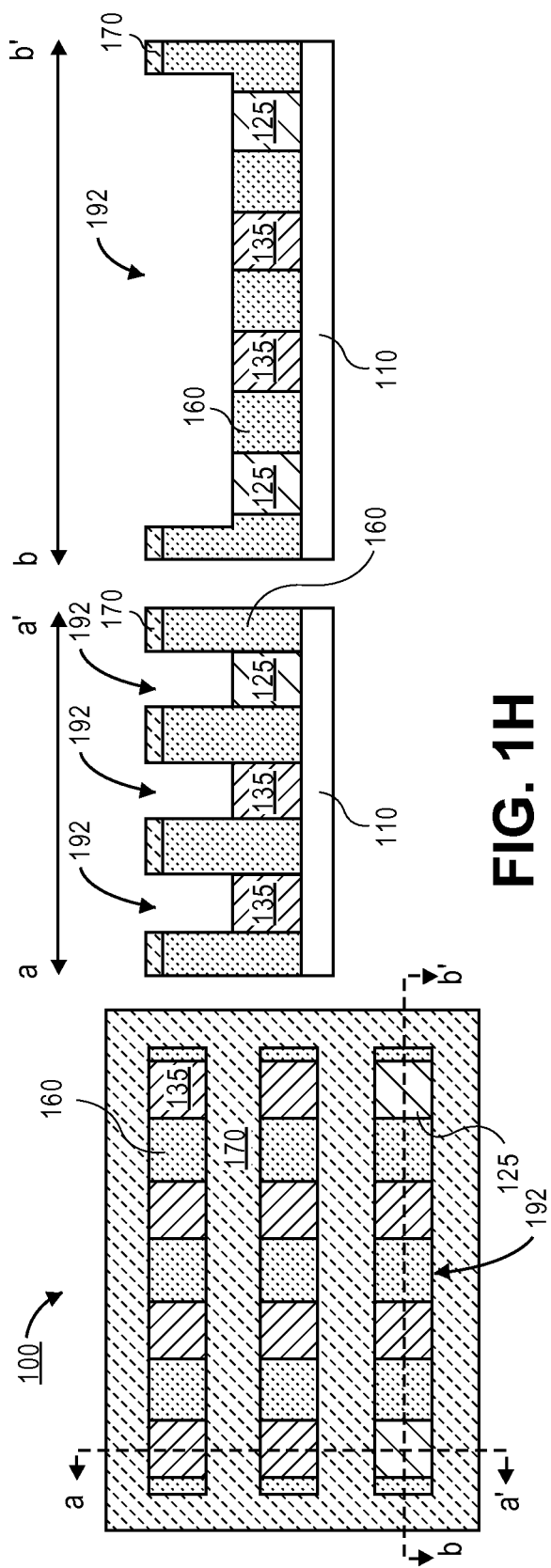
FIG. 1H illustrates a schematic plan view and cross-sectional views of the interconnect layer after trenches for the interconnect lines are formed, in accordance with an embodiment of the invention.

Referring now to FIG. 1H, interconnect line trenches 192 are formed through the permeable etchstop layer 170 and the sacrificial material 160. According to an embodiment, the trenches may be patterned with a photolithography process known in the art and etched with a dry etching process. As illustrated, the trenches 192 expose top surfaces of the vias 125 and the pillars 135.

Figure 1I:
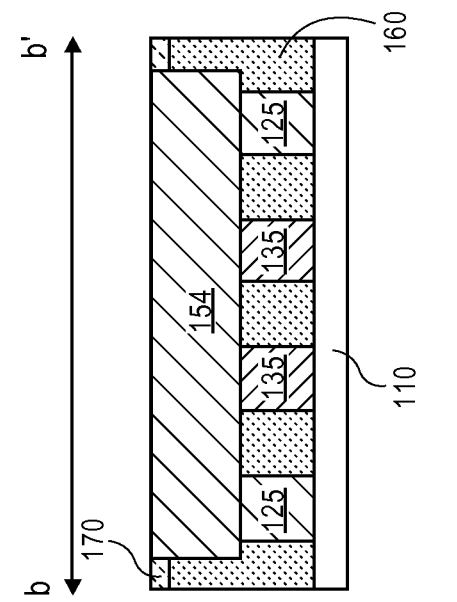
FIG. 1I illustrates a schematic plan view and cross-sectional views of the interconnect layer after the interconnect lines have been formed, in accordance with an embodiment of the invention.
Figure 1I:
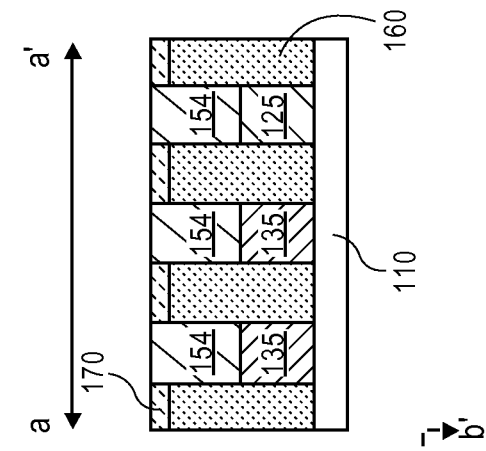
Figure 1I:
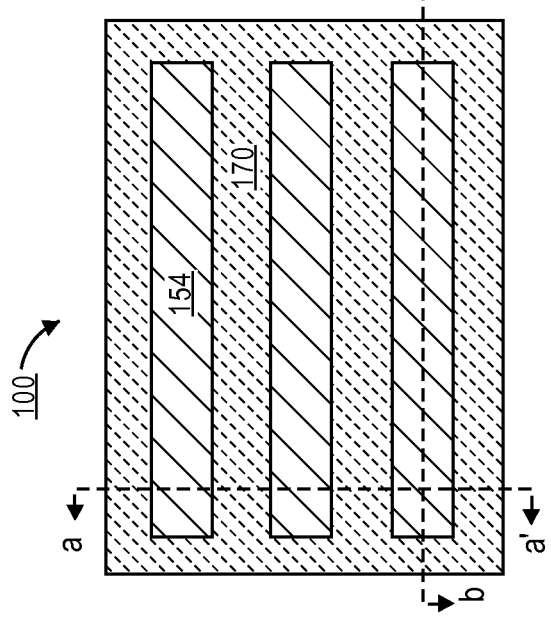

Referring now to FIG. 1I, interconnect lines 154 are formed in the interconnect line trenches 192. According to an embodiment, the interconnect lines 154 may be formed with any suitable deposition process and with any suitable conductive material, such as those described above with respect to the materials used to form the vias 125. In one embodiment, the interconnect lines 154 are formed with the same material used to form the vias 125. As illustrated in FIG. 1I, the interconnect lines are supported from below by the vias 125 and the pillars 135 in addition to the sacrificial material 160.

Figure 1J:
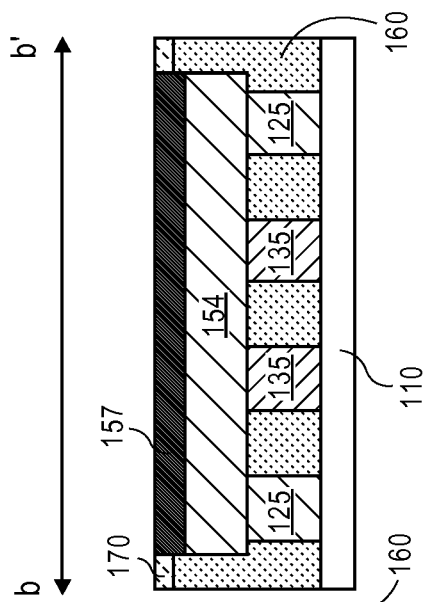
FIG. 1J illustrates a schematic plan view and cross-sectional views of the interconnect layer after an etchstop layer is formed over the top surface of the interconnect lines, in accordance with an embodiment of the invention.
Figure 1J:
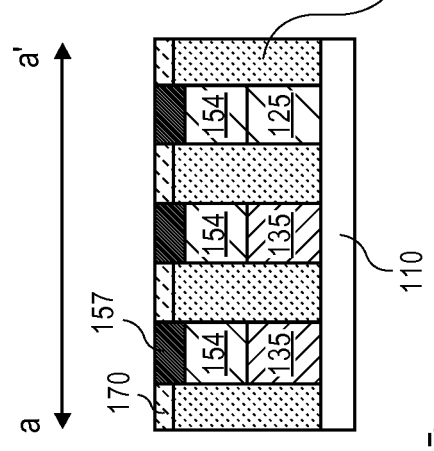
Figure 1J:
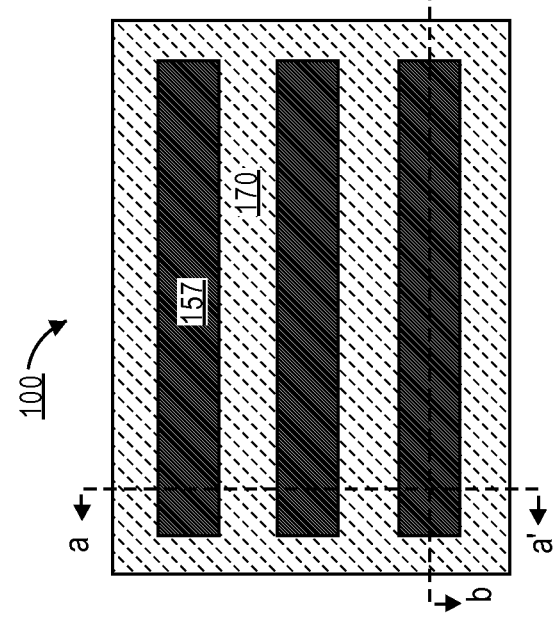

Referring now to FIG. 1J, the interconnect lines 154 may be recessed and an etchstop layer 157 may be formed over the top surface of the interconnect lines 154. According to an embodiment, the top surface of the interconnect lines 154 are recessed with an etching process. After the interconnect lines 154 are recessed, the etchstop layer 157 is deposited over the top surface of the interconnect lines 154. Overburden from the deposition of the etchstop layer 157 may be polished or etched back to ensure that a top surface of the etchstop layer 157 is substantially coplanar with a top surface of the permeable etchstop layer 170. Recessing the interconnect lines 154 allows for the etchstop layer 157 to be self-aligned with the interconnect lines 154. According to an embodiment, the etchstop layer 157 is a material that is etch selective to the permeable etchstop layer 170. The differences in etch selectivity between the etchstop layer 157 and the permeable etchstop layer 170 allow for the formation of vias in subsequent interconnect lines to be misaligned from the interconnect line 154, as will be described in greater detail below. By way of example, the etchstop layer 157 may be any suitable hardmask material, such as $SiO_xC_yN_z$ materials, $SiO_xC_y$ materials, metal oxide materials, metal nitride materials, or the like.

Referring now to FIG. 1K, the sacrificial material 160 is removed from the interconnect layer 100. According to an embodiment of the invention, the sacrificial material 160 may be removed with a wet etching process. The wet etching chemistry may dissolve the sacrificial material 160 which can then be removed through the permeable etchstop layer 170. According to an embodiment, the wet etching process utilizes an etching chemistry that selectively removes the sacrificial material 160 without substantially removing portions of the interconnect lines 154, the vias 125, or the pillars 135. Since the interconnect lines 154 are supported from below by the vias 125 and the pillars 135, the removal of the sacrificial material does not decrease the structural integrity of the interconnect layer 100. By way of example, when the sacrificial material 160 is TiN, the sacrificial material 160 may be removed with a wet etching chemistry that comprises an aqueous solution of hydrogen peroxide having a concentration of about 3-50% by volume, a hydroxide source having a concentration of about 50 to 1,000 ppm by volume, and a corrosion inhibitor having a concentration of about 100 to 4,000 ppm by volume. In a specific embodiment, the removal chemistry comprises an aqueous solution of hydrogen peroxide having a concentration of about 15% by volume, potassium hydroxide having a concentration of about 100 to 250 ppm by volume and a 1,2,4-triazole corrosion inhibitor having a concentration of about 100 to 250 ppm by volume. The removal of the sacrificial material layer 160 can be performed in an immersion mode or a spinning mode. In the immersion mode, the entire structure is dipped into the removal chemistry to remove the sacrificial material layer 160. In the spinning mode, the removal chemistry is sprayed or drained onto the surface of the structure that is spinning. In one embodiment, the removal of the sacrificial material layer 160 is performed at a temperature of about 40 to 60 degrees Celsius for a time duration of about 3 to 10 minutes.

As illustrated, the removal of the sacrificial material 160 produces air gaps 140 in the interconnect layer 100. For example, air gaps 140 may be formed between sidewalls 151 of neighboring interconnect lines 154, and below the bottom surface 152 of the interconnect lines 154. Accordingly, the interconnect lines 154 may be referred to as floating interconnect lines, because portions of the bottom surface 152 of the interconnect lines 154 may not be supported by any material. In such embodiments, the floating interconnect lines 154 may be supported along portions of the bottom surface 152 by one or more vias 125 and one or more pillars 135. As illustrated, the interconnect line 154 in the cross-sectional view along line b-b' is supported by two vias 125 and two pillars 135, however it is to be appreciated that embodiments of the invention are not limited to such configurations. For example, a floating interconnect line may be supported by one or more vias 125. Additionally, embodiments of the invention may also include no pillars 135 below the interconnect lines 154. The number of supports (either vias 125 or pillars 135) needed to support an interconnect line 154 may be dependent on the length of the interconnect line 154. In an embodiment, the interconnect line 154 may need support from below at a regular spacing along its length. The spacing between each support may be dependent on the thickness of the interconnect line 154, the width of the interconnect line 154, the material the interconnect line 154 is formed from, or the like. By way of example, supports may need to be formed at intervals of approximately 20 nm or less. In an embodiment, the interconnect line 154 may need to be supported at intervals of approximately 10 nm or less.

Referring now to FIG. 1L, the permeable etchstop layer 170 is hardened to increase the structural integrity of the interconnect layer 100. For example, the permeable etchstop layer 170 may be hardened by applying a fill material (not shown) that fills the pores of the permeable etchstop layer 170 to form a hardened etchstop layer 171. For example, the hardening may be performed by spin coating a dielectric layer over the surface of the permeable etchstop layer 170. The viscosity of the coating may be chosen so that it readily fills the pores. In an embodiment, the fill material may be a polymer material. The polymer chosen may be chosen so that the molecular size and functional groups of the polymer are adequately sized to fill pores of the permeable etchstop layer 170. By way of example, one polymer that may be used as a fill material is poly(methyl methacrylate) (PMMA). In an embodiment, the fill material may be spun on over the surface, and an anneal process (e.g., a thermal anneal, remote plasma, microwave anneal, laser spiking anneal, or the like) may be implemented to drive the polymer into the permeable etchstop layer 170 and remove solvents on the surface of the etchstop layer. According to an embodiment, the fill material chosen to harden the etchstop layer 171 may also increase the etch selectivity of the hardened etchstop layer 171 with respect to the etchstop layer 157.

Figure 1M:
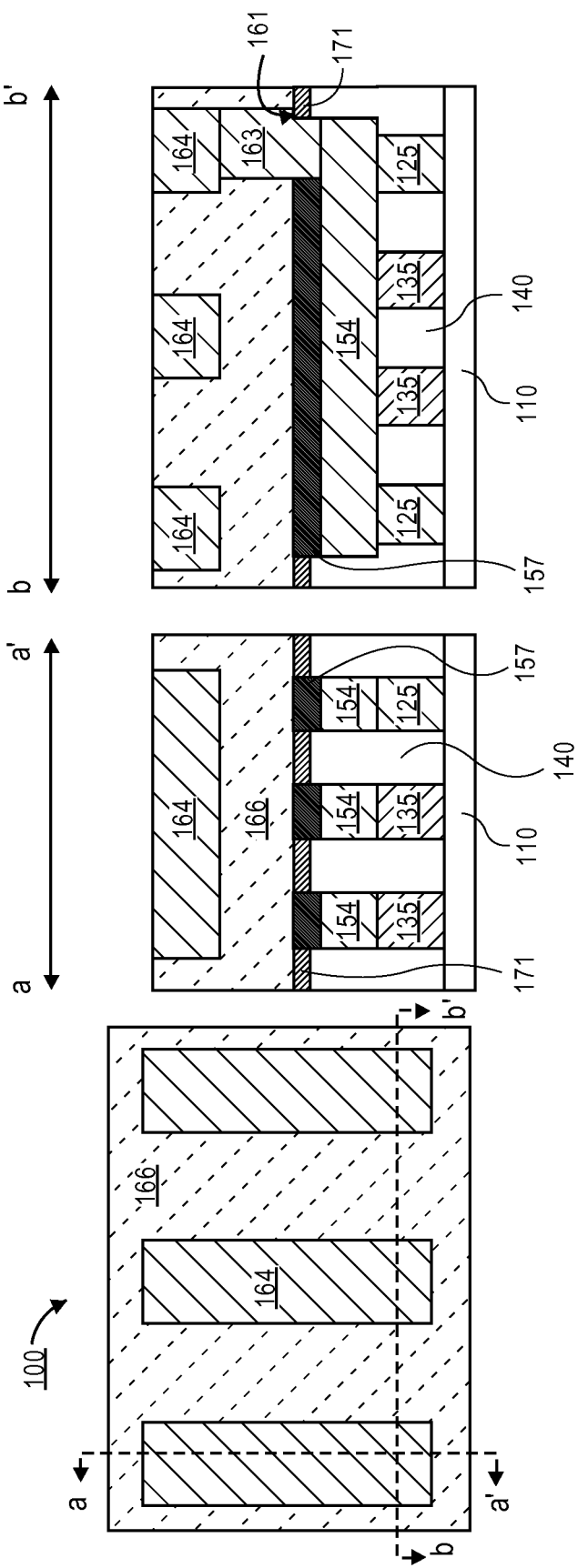
FIG. 1M illustrates a schematic plan view and cross-sectional views of the interconnect layer after the formation of a second interconnect layer, in accordance with an embodiment of the invention.

Referring now to FIG. 1M, the next interconnect layer is formed over the top surfaces of the hardened etchstop layer 171 and the etchstop layer 157 formed over the interconnect lines 154. According to an embodiment, the next interconnect layer may be formed in a dielectric layer 166. By way of example, the dielectric layer 166 may be a low-k or ultra low-k dielectric material. Additional embodiments may include a dielectric layer 166 that is a sacrificial dielectric material similar to sacrificial material 160. In such embodiments, the subsequently formed interconnect layer may also include air gaps similar to those illustrated in FIG. 1L. As illustrated, interconnect lines 164 are formed in the dielectric layer 166. Additionally, one or more vias 163 may be formed between an interconnect line 164 and an interconnect line 154.

According to an embodiment, the via 163 may not be perfectly aligned with the interconnect line 154. For example, a portion of the via 163 may not be formed over a top surface of the interconnect line 154. Since the etchstop material 157 is etch selective to the hardened etchstop layer 171, the etching process used to form the via opening for via 163 will only remove the etchstop material 157 and the hardened etchstop layer 171 remains substantially unaltered. In such an embodiment, a bottom surface of the via 163 may contact the interconnect line 154 and a top surface 161 of the hardened etchstop layer 171, as shown in the cross-sectional view along line b-b' in FIG. 1M.

Embodiments of the invention may also form floating interconnect lines that are supported from below with dual damascene processes. In contrast to the method of forming floating interconnect lines described above with respect to FIGS. 1A-1M where the vias 125 and the interconnect lines 154 were formed with separate metal deposition processes, embodiments of the invention may also include forming the vias and the interconnect lines with a single metal deposition process (i.e., a dual damascene process). An example of the formation of a floating interconnect line with a dual damascene process is described below with respect to FIGS. 2A-2N.

Figure 2A:
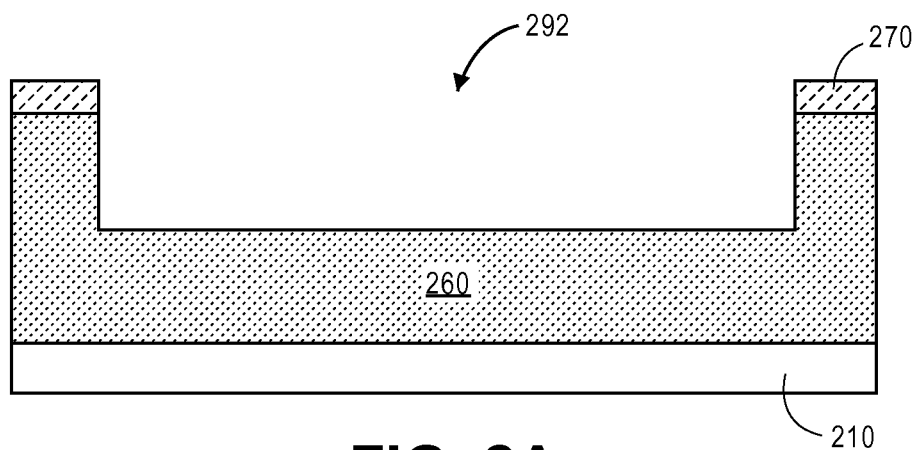
FIG. 2A illustrates a schematic cross-sectional view of an interconnect layer, according to an embodiment of the invention.

Referring now to FIG. 2A, a cross-sectional view of an interconnect layer is illustrated according to an embodiment. In FIG. 2A, a first trench 292 is formed through a permeable etchstop layer 270 and into a sacrificial material layer 260 formed over an underlying substrate 210. According to an embodiment, the sacrificial material 260, the permeable etchstop layer 270 and the underlying substrate 210 are substantially similar to those described above with respect to FIGS. 1A-1M. In an embodiment, the first trench 292 is formed with a length that is substantially the length required for a floating interconnect line that will be formed in a subsequent processing operation. By way of example, the first trench 292 may be formed with a dry-etching process.

Figure 2B:
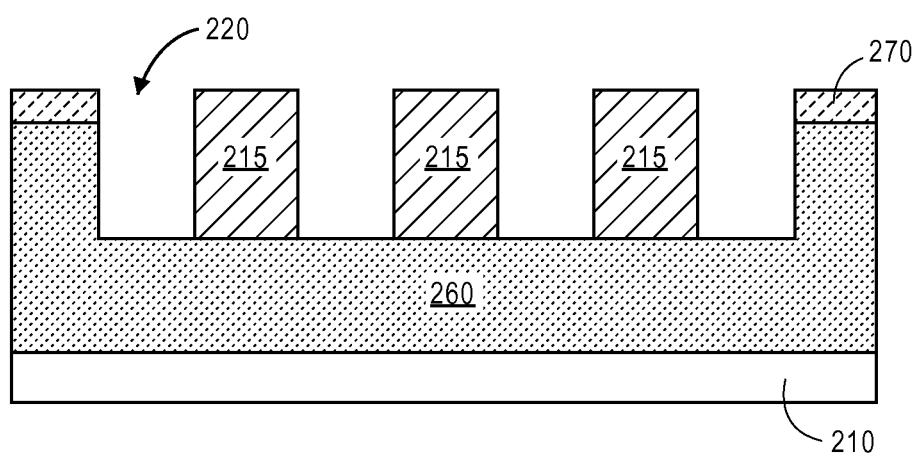
FIG. 2B illustrates a schematic cross-sectional view of the interconnect layer after a sacrificial cross-grating pattern is formed in a trench, according to an embodiment of the invention.

Referring now to FIG. 2B, a cross-grating pattern 215 is formed over the sacrificial material layer 260 in the first trench. The cross-grating pattern 215 may be substantially similar to the pattern formed in the sacrificial material 160 described in FIGS. 1A-1N. As such, a plurality of openings 220 may be formed. According to an embodiment, each of the openings 220 may be used for the formation of a via or a pillar. It is to be appreciated that the cross-grating pattern 215 does not need to be a sacrificial material that is dissolvable. Accordingly, embodiments of the invention may include a cross-grating pattern 215 formed with a hardmask material, such as a carbon hardmask. By way of example, the cross-grating pattern may be formed with one or more photolithography patterning operations, DSA patterning, or the like.

Figure 2C:
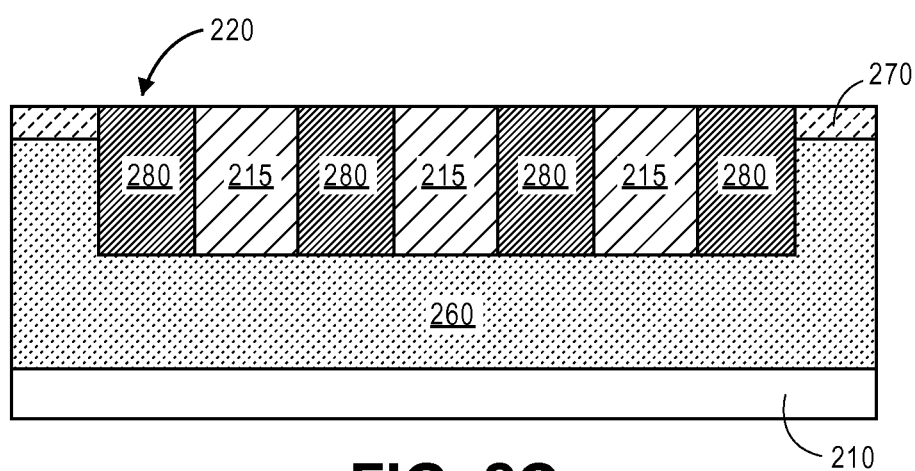
FIG. 2C illustrates a schematic cross-sectional view of the interconnect layer after a photoresist material is deposited into the openings of the sacrificial cross-grating pattern, according to an embodiment of the invention.

Referring now to FIG. 2C, photoresist material 280 is deposited into the openings 220. In an embodiment, the photoresist material may be spun-on. The photoresist material 280 may be any suitable photoresist material, such as a positive or negative photoresist material. By way of example, the photoresist material 280 may be a chemically amplified resist (CAR).

Figure 2D:
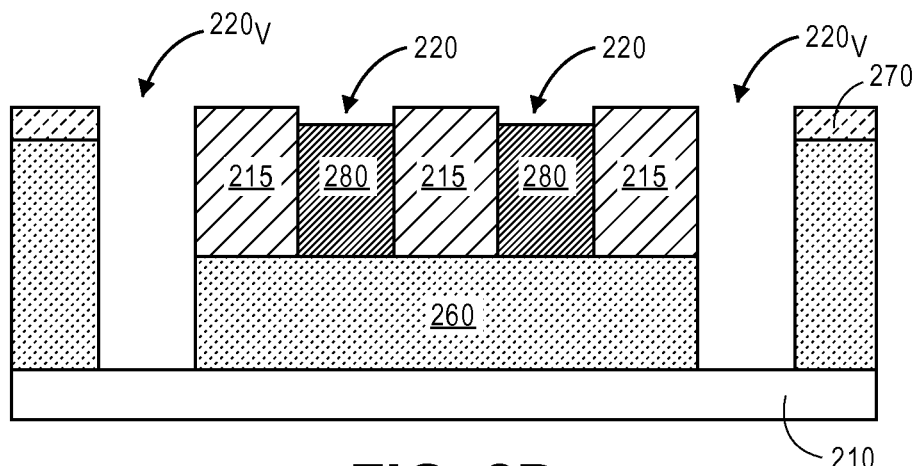
FIG. 2D illustrates a schematic cross-sectional view of the interconnect layer after via openings are formed through the interconnect layer, according to an embodiment of the invention.

Referring now to FIG. 2D, the photoresist material 280 is patterned in order to define openings 220 that will be used to form via openings $220_V$. For example, a photolithography mask (not shown) may be used to selectively expose desired via openings $220_V$. Thereafter, the exposed photoresist material 280 may be developed in order to clear the exposed portions of the photoresist material 280 in each of the openings 220 where a via opening $220_V$ is desired. After the photoresist material 280 is removed from via openings $220_V$, the underlying sacrificial material 260 is removed, for example with a dry-etching process. It is to be appreciated that, while two via openings $220_V$ are illustrated in FIG. 2C, additional embodiments may include as few as one via opening $220_V$ or more than two via openings $220_V$.

Figure 2E:
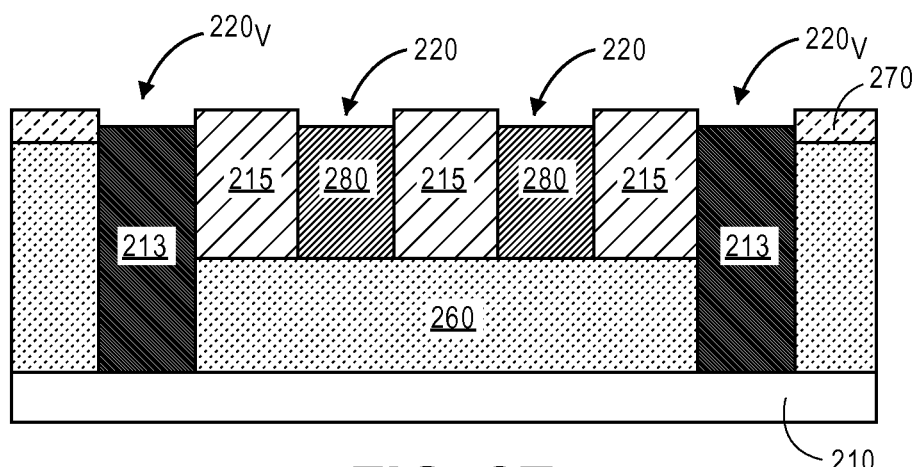
FIG. 2E illustrates a schematic cross-sectional view of the interconnect layer after a sacrificial fill material is deposited into the via openings, according to an embodiment of the invention.
Figure 2F:
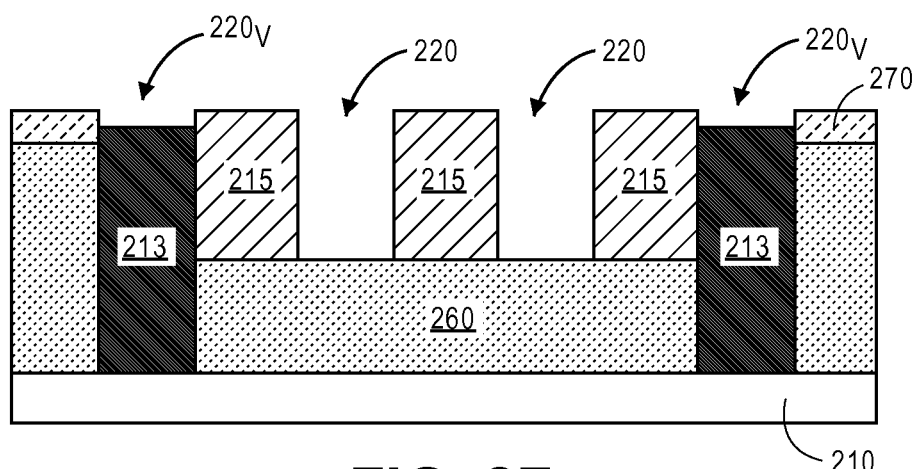
FIG. 2F illustrates a schematic cross-sectional view of the interconnect layer after the photoresist material is removed, according to an embodiment of the invention.

Referring now to FIG. 2E, a sacrificial fill material 213 is deposited into each of the via openings $220_V$. According to an embodiment, any overburden from the deposition of the sacrificial fill material 213 may be removed with an etching process. Referring now to FIG. 2F, the remaining photoresist material 280 is removed from the openings 220. In an embodiment, the photoresist material 280 may be removed with an ashing process.

Figure 2G:
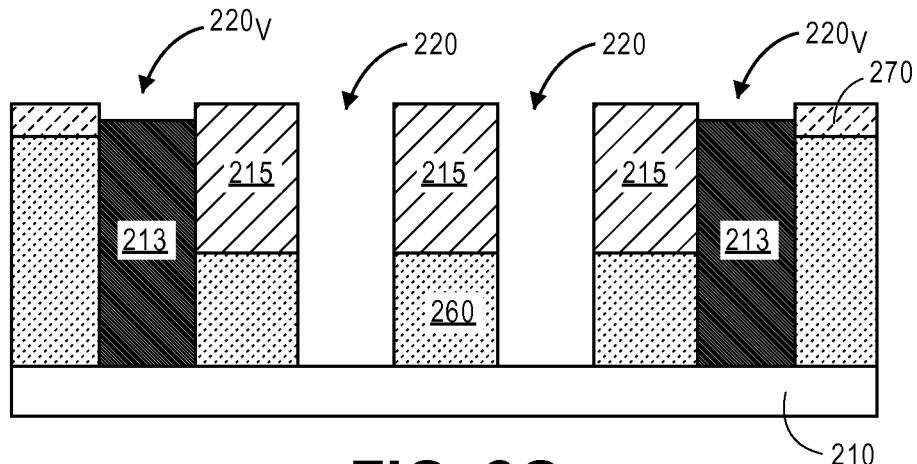
FIG. 2G illustrates a schematic cross-sectional view of the interconnect layer after openings for the pillars are formed, according to an embodiment of the invention.
Figure 2H:
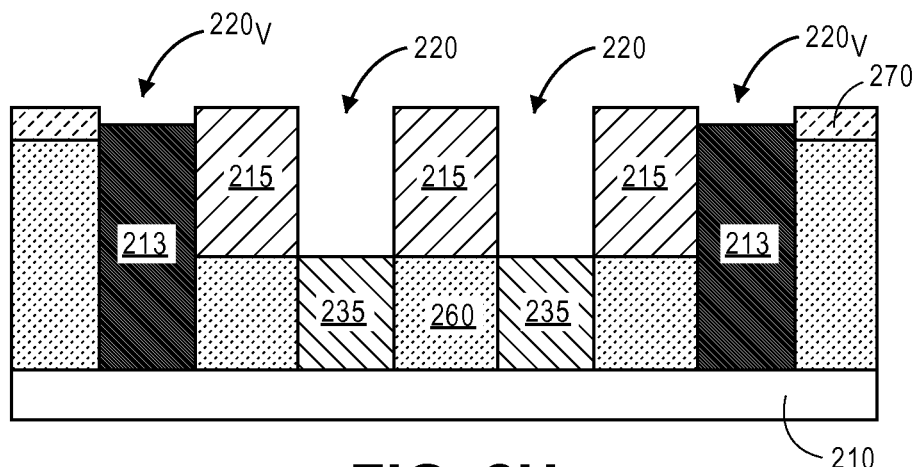
FIG. 2H illustrates a schematic cross-sectional view of the interconnect layer after the pillars have been formed in the openings, according to an embodiment of the invention.

Referring now to FIG. 2G, the sacrificial material 260 below the openings 220 is removed. By way of example, the sacrificial material may be removed with a dry-etching process that utilizes the sacrificial fill material 213 and the cross-grating pattern 215 as an etch mask. Thereafter, in FIG. 2H, the pillars 235 are formed in the openings 220. According to an embodiment, the pillars 235 may be formed with a low-k dielectric material. In an embodiment, the pillars 235 may be a hardmask material. By way of example, the pillars 235 may be silicon dioxide, carbon doped silicon dioxide, porous silicon dioxide, silicon nitrides, metal oxides, metal nitrides, or the like. Additional embodiments may include other dielectric materials, such as fluorocarbon based dielectrics, oxyfluorides, carbon based dielectrics, or the like. Embodiments include depositing the pillars 235 into the openings 220 with any suitable process, such as, for example, PVD, CVD, ALD, spin coating, or the like. In an embodiment, any overburden from the deposition of the pillars 235 may be removed with an etching process.

Figure 2I:
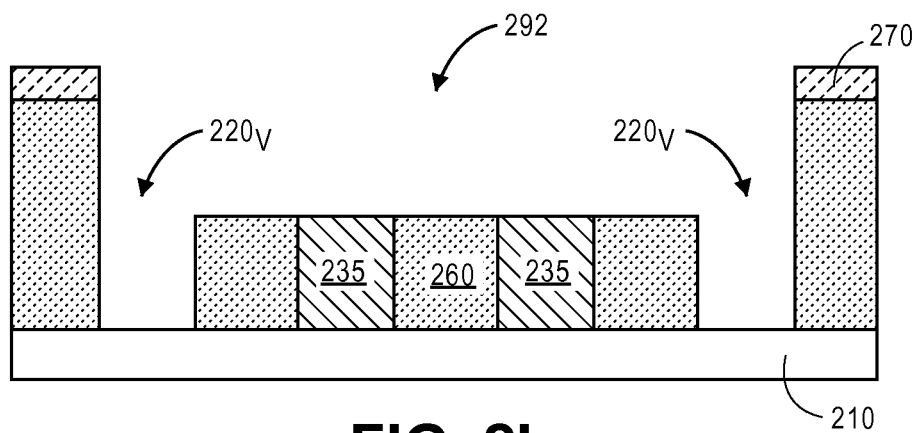
FIG. 2I illustrates a schematic cross-sectional view of the interconnect layer after the sacrificial fill material and the sacrificial cross-grating pattern are removed, according to an embodiment of the invention.

Referring now to FIG. 2I, the sacrificial fill material 213 and the cross-grating pattern 215 are removed. In an embodiment, the sacrificial fill material 213 and the cross-grating pattern 215 may be removed with one or more etching processes that selectively remove the sacrificial fill material 213 and the cross-grating pattern 215 without substantially removing the sacrificial material 260 and the pillars 235.

Figure 2J:
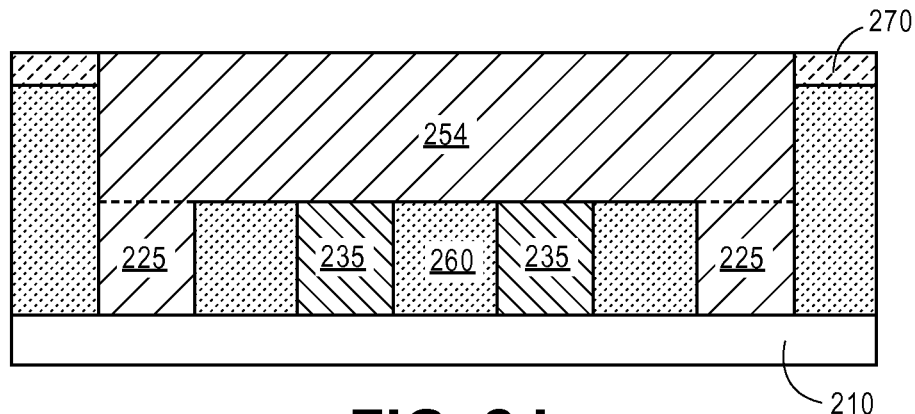
FIG. 2J illustrates a schematic cross-sectional view of the interconnect layer after the vias and interconnect lines are formed, according to an embodiment of the invention.

Referring now to FIG. 2J, vias 225 and interconnect line 254 are formed with a deposition process. According to an embodiment, the vias 225 and the interconnect line 254 may be formed with any suitable conductive material. By way of example, the conductive material may include Ag, Au, Co, Cu, Mo, Ni, NiSi, Pt, Ru, TiN, W, or the like. Embodiments of the invention include depositing the vias 125 with any suitable deposition process, such as PVD, CVD, ALD, electroplating, electroless plating, or the like. In an embodiment, overburden from the deposition of the conductive material may then be recessed, with a polishing process to ensure that a top surface of the interconnect line 254 is substantially coplanar with a top surface of the permeable etchstop layer 270. As illustrated, the vias 225 are separated from the interconnect line 254 by a dashed line. However, it is to be appreciated that a single deposition process may be used to form both the interconnect line 254 and the vias 225, and therefore, there may be no discernable distinction between the two features in a finished device.

Figure 2K:
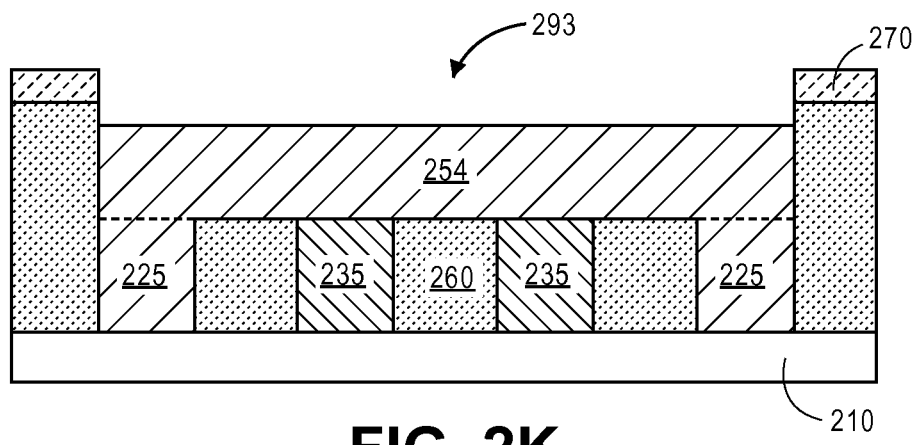
FIG. 2K illustrates a schematic cross-sectional view of the interconnect layer after the interconnect line is recessed, according to an embodiment of the invention.
Figure 2L:
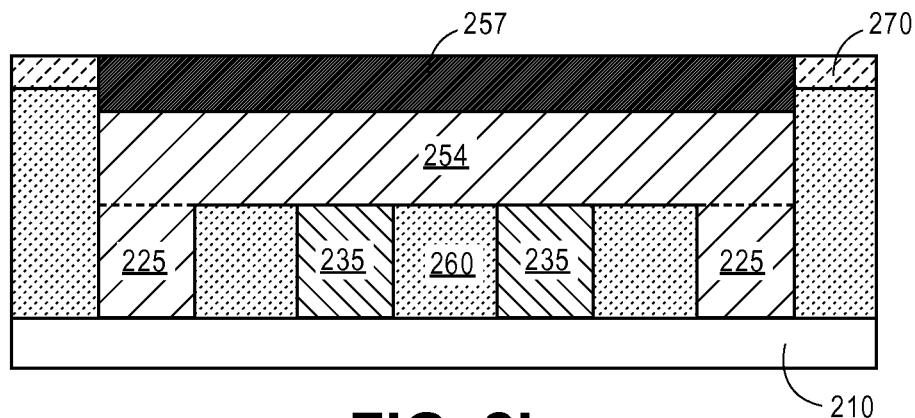
FIG. 2L illustrates a schematic cross-sectional view of the interconnect layer after an etchstop layer is formed over the interconnect line, according to an embodiment of the invention.

Referring now to FIG. 2K, the interconnect line 254 may be recessed to form a recess 293. By way of example, the recess 293 may be formed with an etching process. Forming the recess 293 allows for the formation of an etchstop layer 257 that is self-aligned over the interconnect line 254, as illustrated in FIG. 2L. According to an embodiment, the etchstop layer 257 may be a material that is etch selective to the permeable etchstop layer 270. As such, misaligned vias in a subsequently formed interconnect layer will be prevented from breaking through to the air-gaps below.

Figure 2M:
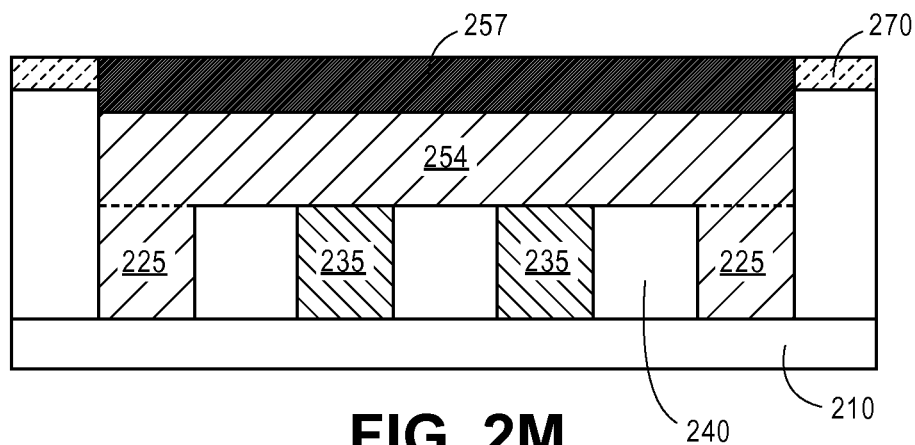
FIG. 2M illustrates a schematic cross-sectional view of the interconnect layer after the sacrificial material is removed, according to an embodiment of the invention.

Referring now to FIG. 2M, the sacrificial material 260 is removed from the interconnect layer. According to an embodiment of the invention, the sacrificial material 260 may be removed with a wet-etching process. The wet-etching chemistry may dissolve the sacrificial material 260 which can then be removed through the permeable etchstop layer 270. According to an embodiment, the wet-etching process utilizes an etching chemistry that selectively removes the sacrificial material 260 without substantially removing portions of interconnect lines 254, the vias 225, or the pillars 235. Additional embodiments may include a sacrificial material 260 that is removable through the permeable layer 270 with a vapor phase process, with a plasma process, or the like. Since the interconnect lines 254 are supported from below by the vias 225 and the pillars 235, the removal of the sacrificial material 260 does not decrease the structural integrity of the interconnect layer. By way of example, when the sacrificial material 260 is TiN, the sacrificial material 260 may be removed with a wet etching chemistry that comprises an aqueous solution of hydrogen peroxide having a concentration of about 3-50% by volume, a hydroxide source having a concentration of about 50 to 1,000 ppm by volume, and a corrosion inhibitor having a concentration of about 100 to 4,000 ppm by volume.

As illustrated, the removal of the sacrificial material 260 produces air gaps 240 in the interconnect layer. For example, air gaps 240 may be formed between sidewalls of the interconnect lines 254, and below the bottom surface of the interconnect lines 254. Accordingly, the interconnect lines 254 may be referred to as floating interconnect lines, because portions of the bottom surface of the interconnect lines 254 may not be supported by any material. In such embodiments, the floating interconnect lines 254 may be supported along the bottom surface by one or more vias 225 and one or more pillars 235. As illustrated, the interconnect line 254 is supported by two vias 225 and two pillars 235, however it is to be appreciated that embodiments of the invention are not limited to such configurations. For example, a floating interconnect line may be supported by one or more vias 225. Additionally, embodiments of the invention may also include no pillars 235 below the interconnect line 254. The number of supports (either vias 225 or pillars 235) needed to support an interconnect line may be dependent on the length of the interconnect line. In an embodiment, the interconnect line 254 may need support from below at a regular spacing along its length. The spacing between each support may be dependent on the thickness of the interconnect line 254, the width of the interconnect line, the material the interconnect line is formed from, or the like. By way of example, supports may need to be formed at intervals of approximately 20 nm or less. In an embodiment, the interconnect line 254 may need to be supported at intervals of approximately 10 nm or less.

Figure 2N:
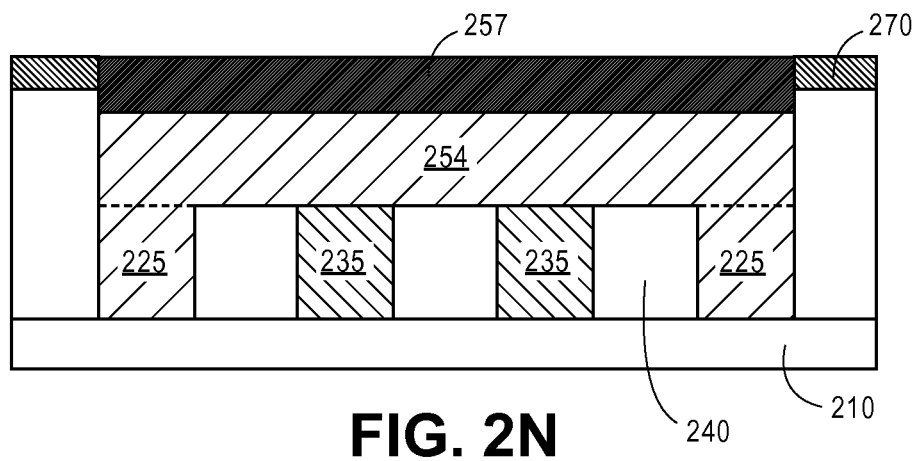
FIG. 2N illustrates a schematic cross-sectional view of the interconnect layer after the permeable etchstop layer is hardened, according to an embodiment of the invention.

Referring now to FIG. 2N, the permeable etchstop layer 270 is hardened to increase the structural integrity of the interconnect layer. For example, the permeable etchstop layer 270 may be hardened by applying a fill material (not shown) that fills the pores of the permeable etchstop layer 270 to form a hardened etchstop layer 271. For example, the hardening may be performed by spin coating a dielectric layer over the surface of the permeable etchstop layer 270. The viscosity of the coating may be chosen so that it readily fills the pores. According to an embodiment, the fill material chosen to harden the etchstop layer 271 may also increase the etch selectivity of the hardened etchstop layer 271 with respect to the etchstop layer 257. Embodiments of the invention may utilize a fill material, such as a polymer, that is substantially similar to those described above with respect to the fill materials used to harden the etchstop layer 171. After the permeable etchstop layer 270 is hardened into a hardened etchstop layer 271, an additional interconnect layer may be formed over the etchstop layer 257 and the hardened etchstop layer 271, according to an embodiment. The formation of a subsequent interconnect layer is substantially similar to the process described above with respect to FIG. 1M, and therefore, will not be repeated here.

Additional embodiments of the invention may also include a process for forming floating interconnect lines with an additional dual damascene process. Such an embodiment is described below with respect to FIGS. 3A-3F.

Figure 3A:
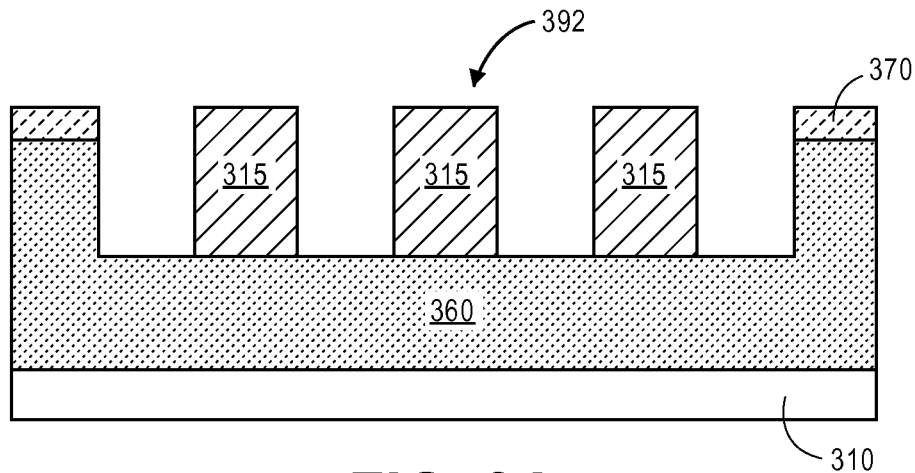
FIG. 3A illustrates a schematic cross-sectional view of an interconnect layer after a sacrificial cross-grating pattern is formed in a trench, according to an embodiment of the invention.

Referring now to FIG. 3A, an interconnect structure substantially similar to the interconnect structure described above with respect to FIG. 2B is shown. In the illustrated embodiment, a trench 392 is formed through a permeable etchstop layer 370 and into a sacrificial material 360 with a cross-grating pattern 315 formed in the trench.

Figure 3B:
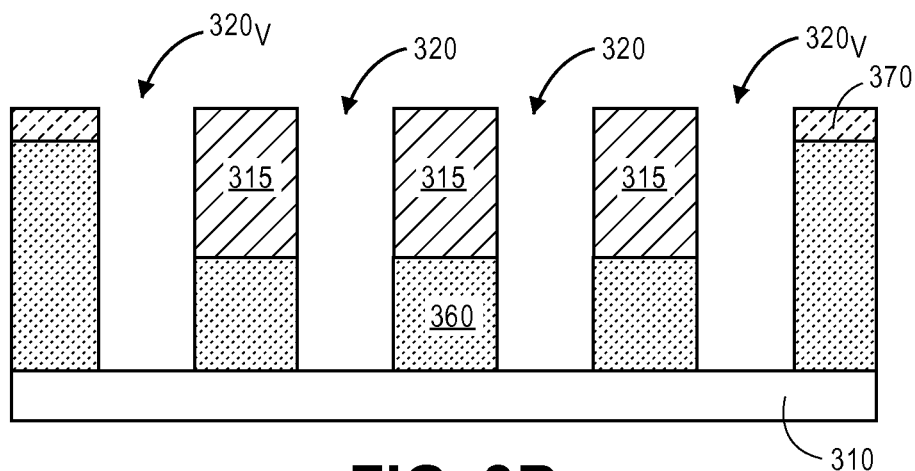
FIG. 3B illustrates a schematic cross-sectional view of the interconnect layer after the via openings and pillar openings are formed, according to an embodiment of the invention.

Referring now to FIG. 3B, openings $320_v$ and 320 are formed through the sacrificial material 360 to expose an underlying substrate 310. The openings $320_v$ and 320 may be formed with a dry-etching process that utilizes the cross-grating pattern 315 as an etch mask. According to an embodiment, two via openings 320$_V$ and two pillar openings 320 are formed.

Figure 3C:
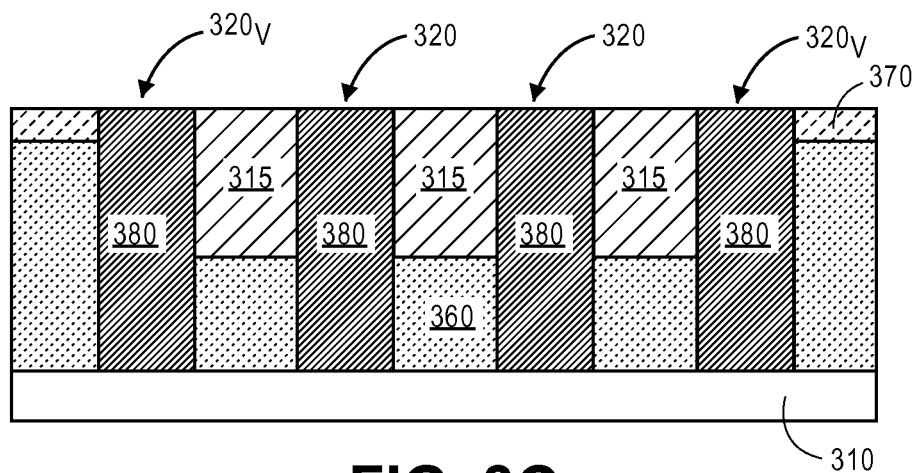
FIG. 3C illustrates a schematic cross-sectional view of the interconnect layer after the openings are filled with a photoresist material, according to an embodiment of the invention.

Referring now to FIG. 3C, the openings 320$_V$ and 320 are filled with a photoresist material 380. In an embodiment, the photoresist material 380 may be spun-on. The photoresist material 380 may be any suitable photoresist material, such as a positive or negative photoresist material. By way of example, the photoresist material 380 may be a chemically amplified resist (CAR).

Figure 3D:
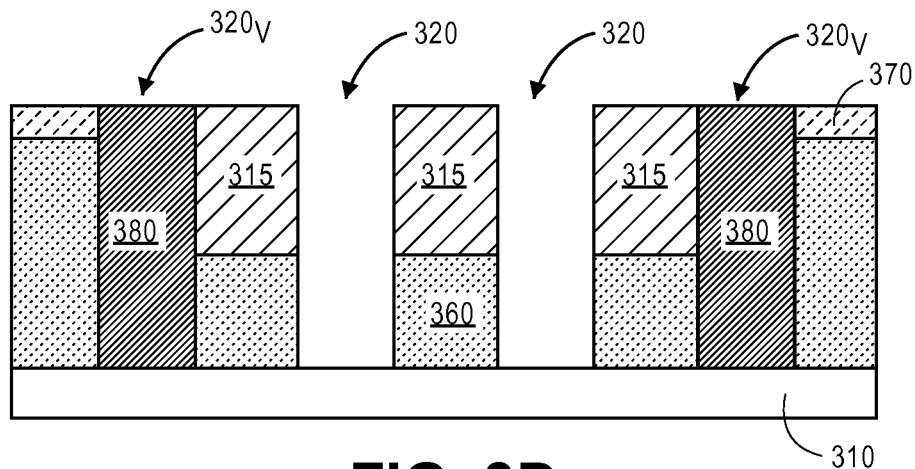
FIG. 3D illustrates a schematic cross-sectional view of the interconnect layer after the photoresist material in the pillar openings is removed, according to an embodiment of the invention.
Figure 3E:
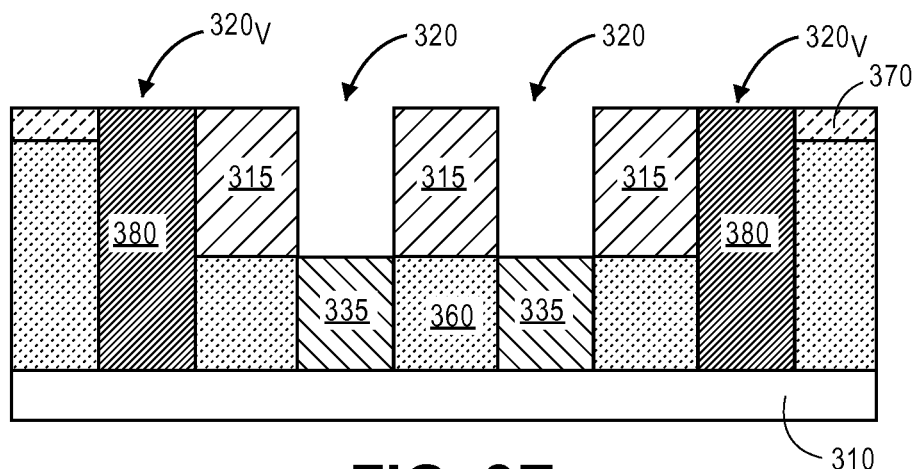
FIG. 3E illustrates a schematic cross-sectional view of the interconnect layer after the pillars are formed in the pillar openings, according to an embodiment of the invention.

Referring now to FIG. 3D, the photoresist material 380 in the pillar openings 320 is patterned. For example, a photolithography mask (not shown) may be used to selectively expose desired pillar openings 320. Thereafter, the exposed photoresist material 380 may be developed in order to clear the exposed portions of the photoresist material from the pillar openings 320. Thereafter, the pillar openings 320 may be filled with a dielectric material to form pillars 335, as illustrated in FIG. 3E. According to an embodiment, the pillars 335 may be formed with a low-k dielectric material. In an embodiment, the pillars 335 may be a hardmask material. By way of example, the pillars may be silicon dioxide, carbon doped silicon dioxide, porous silicon dioxide, silicon nitrides, metal oxides, metal nitrides, or the like. Additional embodiments may include other dielectric materials, such as fluorocarbon based dielectrics, oxyfluorides, carbon based dielectrics, or the like. Embodiments include depositing the pillars 335 into the openings 320 with any suitable process, such as, for example, PVD, CVD, ALD, a spin coating process, or the like. According to an embodiment, the pillars 335 may be etched back to the desired height after the dielectric material has been deposited.

Figure 3F:
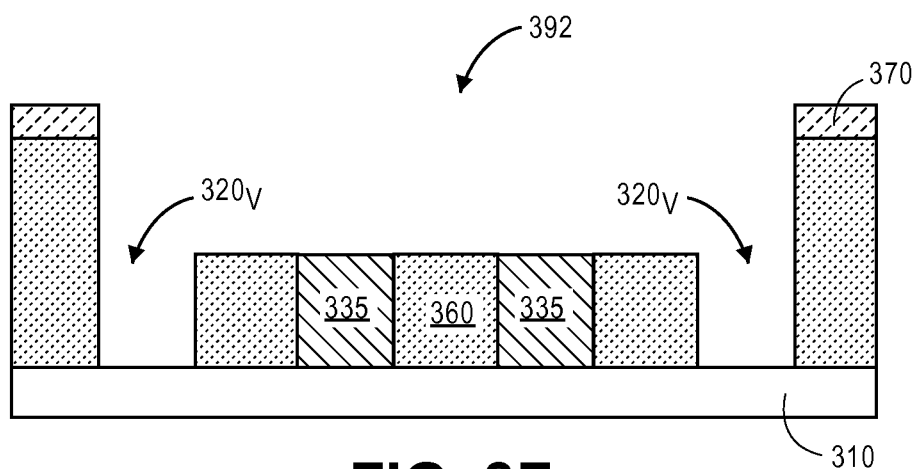
FIG. 3F illustrates a schematic cross-sectional view of the interconnect layer after the remaining photoresist material and the sacrificial cross-grating pattern are removed, according to an embodiment of the invention.

Referring now to FIG. 3F, the remaining photoresist material 380 may be removed from the via openings 320$_V$ and the cross-grating pattern 315 may be removed. For example, the photoresist material 380 may be removed with an ashing process and the sacrificial cross-grating pattern 315 may be removed with an etching process. After the removal of the photoresist material 380 and the cross-grating material 315, the interconnect layer in FIG. 3F is substantially similar to the interconnect structure illustrated in FIG. 2I. Accordingly, the vias and interconnect lines may be formed according to substantially the same processing operations disclosed with respect to FIGS. 2K-2N in order to form floating interconnect lines with air gaps between and below each interconnect line.

Figure 4:
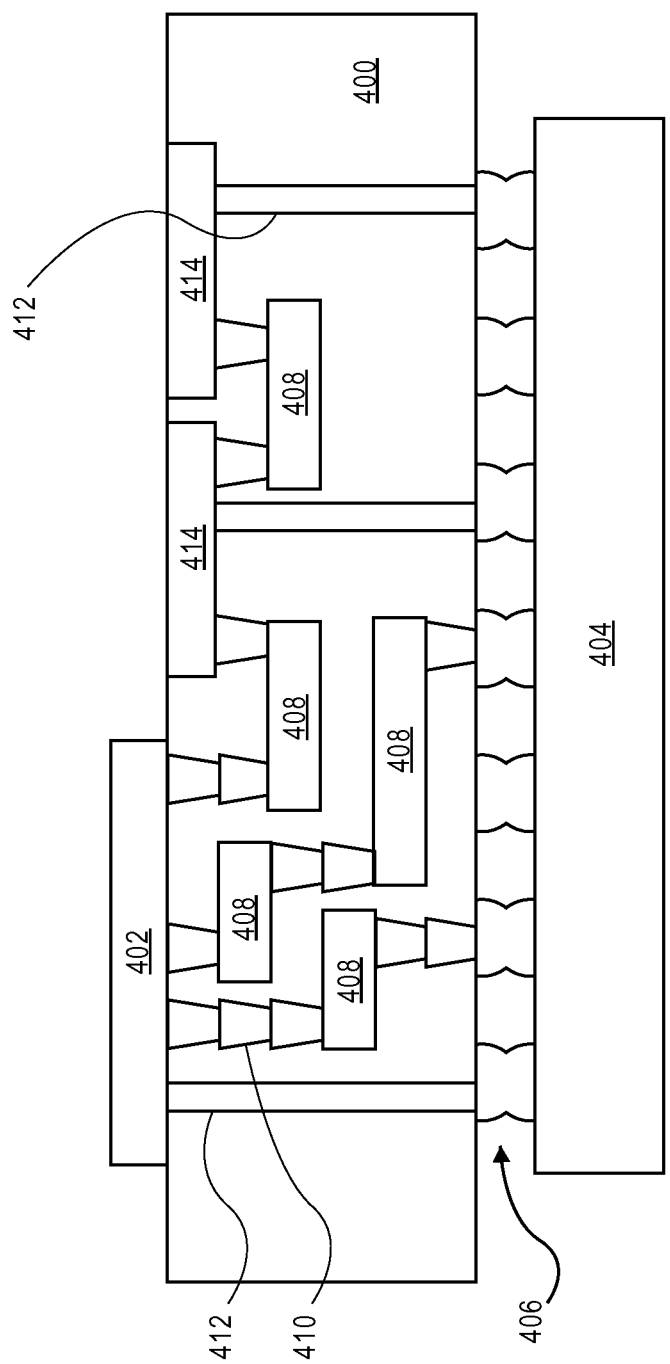
FIG. 4 is a cross-sectional illustration of an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses that include floating interconnect lines with air gaps below and between interconnect lines or processes for forming such devices disclosed herein may be used in the fabrication of interposer 400.

Figure 5:
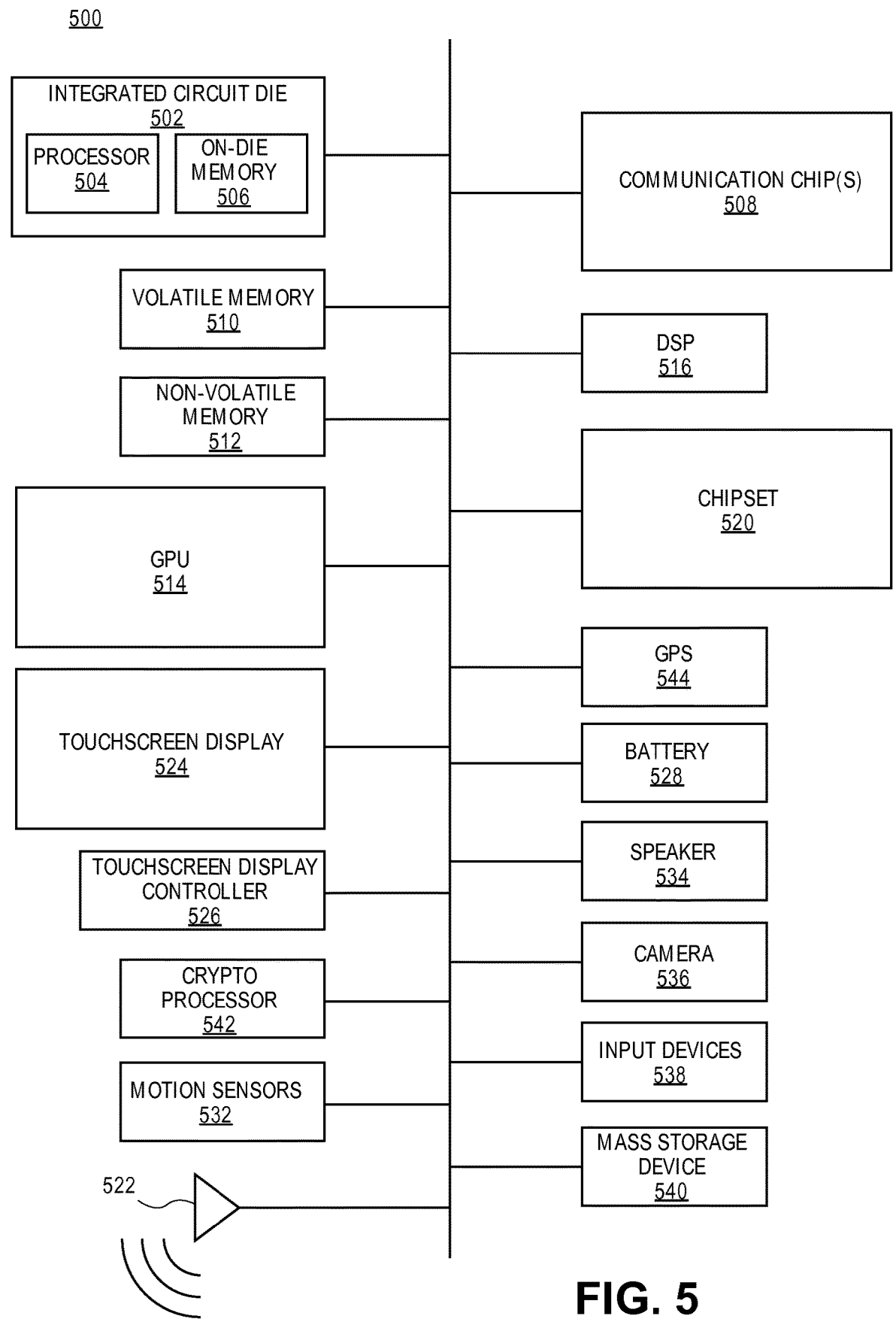
FIG. 5 is a schematic of a computing device built in accordance with an embodiment of the invention

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 528, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors that are coupled to one or more self-aligned interconnect lines, vias, or plugs that are formed in an interconnect structure that that are formed with a subtractive patterning operation that utilizes a textile patterned hardmask layer, according to an embodiment of the invention. The term "processor" may refer to any device or portion of a device that processes electronic data from registers and/or memory to transform that electronic data into other electronic data that may be stored in registers and/or memory.

The communication chip 508 may also include one or more devices, such as transistors that are coupled to one or more floating interconnect lines with air gaps below and between interconnect lines, according to an embodiment of the invention.

In further embodiments, another component housed within the computing device 500 may contain one or more devices, such as transistors that are coupled to one or more floating interconnect lines with air gaps below and between interconnect lines, according to an embodiment of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include an interconnect layer that comprises an interconnect line, wherein first portions of a bottom surface of the interconnect line are bordered by an air-gap; and one or more vias formed in contact with second portions of the bottom surface of the interconnect line, wherein the one or more vias are bordered by air-gaps.

Additional embodiments of the invention include an interconnect layer that further comprises: one or more pillars formed in contact with the second portions of the bottom surface of the interconnect line, wherein the one or more pillars are bordered by air-gaps.

Additional embodiments of the invention include an interconnect layer, wherein the pillars are a low-k dielectric material.

Additional embodiments of the invention include an interconnect layer, wherein the one or more pillars are spaced apart from each other by 20 nm or less.

Additional embodiments of the invention include an interconnect layer, wherein a first etchstop layer is formed over a top surface of the interconnect line.

Additional embodiments of the invention include an interconnect layer, wherein a second etchstop layer that is etch selective to the first etchstop layer is formed adjacent to the first etchstop layer, and wherein the second etchstop layer is formed over the air-gaps.

Additional embodiments of the invention include an interconnect layer, wherein the second etchstop layer is a porous dielectric material that has pores filled with a pore plugging dielectric material.

Additional embodiments of the invention include an interconnect layer that further comprises a next level via formed through the first etchstop layer and in contact with a top surface of the interconnect line and wherein the next level via also contacts a top surface of the second etchstop layer.

Additional embodiments of the invention include an interconnect layer that further comprises a second interconnect line, wherein first portions of a bottom surface of the second interconnect line are bordered by an air-gap.

Additional embodiments of the invention include an interconnect layer, wherein a sidewall of the second interconnect line is separated from a sidewall of the first interconnect line by an air-gap.

Embodiments of the invention include a method of forming an interconnect layer, that comprises: forming a plurality of openings in a first sacrificial material layer, wherein the openings include one or more pillar openings and one or more via openings; forming pillars in the pillar openings and vias in the via openings; forming a second sacrificial material layer over a top surface of the pillars, the vias, and the first sacrificial material layer; forming a permeable etchstop layer over a top surface of the second sacrificial layer; forming an interconnect line trench through permeable etchstop layer and into the second sacrificial layer so that the vias and the pillars are exposed; forming an interconnect line in the interconnect line trench, wherein a top surface of the interconnect layer is covered by an etchstop layer, wherein a top surface of the etchstop layer is substantially coplanar with a top surface of the permeable etchstop layer; removing the first and second sacrificial material layers through the permeable etchstop layer; and hardening the permeable etchstop layer so that the permeable etchstop layer is no longer permeable.

Additional embodiments of the invention include a method of forming an interconnect layer, wherein the first and second sacrificial material layers are titanium nitride.

Additional embodiments of the invention include a method of forming an interconnect layer, wherein removing the first and second sacrificial material layers includes applying a wet etching chemistry that dissolves the first and second sacrificial layers and removing the dissolved first and second sacrificial materials through the permeable etchstop layer.

Additional embodiments of the invention include a method of forming an interconnect layer, wherein hardening the permeable etchstop layer includes applying a plugging material over the surface of the permeable etchstop layer.

Additional embodiments of the invention include a method of forming an interconnect layer, wherein the plugging material is spin coated over the surface of the permeable etchstop layer.

Additional embodiments of the invention include a method of forming an interconnect layer, wherein the etchstop layer formed over the interconnect line is self-aligned with the interconnect line.

Additional embodiments of the invention include a method of forming an interconnect layer, wherein the etchstop layer formed over the interconnect line is self-aligned with the interconnect line by recessing the interconnect line so that a top surface of the interconnect line is below a top surface of the permeable etchstop layer, and then filling the recess above the interconnect line with the etchstop layer so that a top surface of the etchstop layer is substantially coplanar with a top surface of the permeable etchstop layer.

Embodiments of the invention include a method of forming an interconnect layer, comprising: forming a first opening through a permeable etchstop layer and into a sacrificial material layer formed below the permeable etchstop layer; forming a cross-grating pattern in the first opening, wherein the cross-grating pattern includes a plurality of pillar openings and via openings; removing the sacrificial material below the pillar openings and the via openings; forming a masking material in the via openings; forming pillars in the pillar openings; removing the masking material in the via openings; forming vias in the via openings and an interconnect line above the vias and the pillars, wherein a top surface of the interconnect layer is covered by an etchstop layer, and wherein a top surface of the etchstop layer is substantially coplanar with a top surface of the permeable etchstop layer; removing the sacrificial material layer through the permeable etchstop layer; and hardening the permeable etchstop layer so that the permeable etchstop layer is no longer permeable.

Additional embodiments of the invention include a method of forming an interconnect layer, wherein the sacrificial material below the pillar openings and the sacrificial material below the via openings are removed with the same etching process.

Additional embodiments of the invention include a method of forming an interconnect layer, wherein the masking material in the via openings is a photoresist material.

Additional embodiments of the invention include a method of forming an interconnect layer, wherein the sacrificial material below the pillar openings and the sacrificial material below the via openings are removed with different etching processes.

Additional embodiments of the invention include a method of forming an interconnect layer, wherein the masking material in the via openings is a sacrificial hardmask material.

Embodiments of the invention include an interconnect layer that comprises an interconnect line, wherein first portions of a bottom surface of the interconnect line are bordered by an air-gap, and wherein a first etchstop layer is formed over a top surface of the interconnect line; one or more vias formed in contact with second portions of the bottom surface of the interconnect line, wherein the one or more vias are bordered by air-gaps; one or more pillars formed in contact with the second portions of the bottom surface of the interconnect line, wherein the one or more pillars are bordered by air-gaps; and a second etchstop layer that is etch selective to the first etchstop layer formed adjacent to the first etchstop layer and over the air-gaps, wherein the second etchstop layer is a porous dielectric material that has pores filled with a pore plugging material.

Additional embodiments of the invention include an interconnect layer that further comprises a next level via formed through the first etchstop layer and in contact with a top surface of the interconnect line and wherein the next level via also contacts a top surface of the second etchstop layer.

Additional embodiments of the invention include an interconnect layer, wherein the sacrificial material is titanium nitride.

What is claimed is:

1. An interconnect layer, comprising:
an interconnect line, wherein first portions of a bottom surface of the interconnect line are bordered by an air-gap, wherein the interconnect line has an upper surface, and the air gap has an upper surface, and wherein the upper surface of the air gap is above the upper surface of the interconnect line;
a first etchstop layer over a top surface of the interconnect line; and
one or more vias formed in contact with second portions of the bottom surface of the interconnect line, wherein the one or more vias are bordered by air-gaps.

2. The interconnect layer of claim 1, further comprising:
one or more pillars formed in contact with the second portions of the bottom surface of the interconnect line, wherein the one or more pillars are bordered by air-gaps.

3. The interconnect layer of claim 2, wherein the pillars are a low-k dielectric material.

4. The interconnect layer of claim 2, wherein the one or more pillars are spaced apart from each other by 20 nm or less.

5. The interconnect layer of claim 1, wherein a second etchstop layer that is etch selective to the first etchstop layer is formed adjacent to the first etchstop layer, and wherein the second etchstop layer is formed over the air-gaps.

6. The interconnect layer of claim 5, wherein the second etchstop layer is a porous dielectric material that has pores filled with a pore plugging dielectric material.

7. The interconnect layer of claim 6, further comprising:
a next level via formed through the first etchstop layer and in contact with a top surface of the interconnect line and wherein the next level via also contacts a top surface of the second etchstop layer.

8. The interconnect layer of claim 1, further comprising:
a second interconnect line, wherein first portions of a bottom surface of the second interconnect line are bordered by an air-gap.

9. The interconnect layer of claim 8, wherein a sidewall of the second interconnect line is separated from a sidewall of the first interconnect line by an air-gap.

10. An interconnect layer, comprising:
an interconnect line, wherein first portions of a bottom surface of the interconnect line are bordered by an air-gap, and wherein a first etchstop layer is formed over a top surface of the interconnect line, wherein the interconnect line has an upper surface, and the air gap has an upper surface, and wherein the upper surface of the air gap is above the upper surface of the interconnect line;
one or more vias formed in contact with second portions of the bottom surface of the interconnect line, wherein the one or more vias are bordered by air-gaps;

one or more pillars formed in contact with the second portions of the bottom surface of the interconnect line, wherein the one or more pillars are bordered by air-gaps; and a second etchstop layer that is etch selective to the first etchstop layer formed adjacent to the first etchstop layer and over the air-gaps, wherein the second etchstop layer is a porous dielectric material that has pores filled with a pore plugging material.

11. The interconnect layer of claim 10, further comprising:

a next level via formed through the first etchstop layer and in contact with a top surface of the interconnect line and wherein the next level via also contacts a top surface of the second etchstop layer.

* * * * *